(12) United States Patent
Paul et al.

(10) Patent No.: US 11,682,632 B2
(45) Date of Patent: Jun. 20, 2023

(54) INTEGRATED DEVICE COMPRISING PERIPHERY STRUCTURE CONFIGURED AS AN ELECTRICAL GUARD RING AND A CRACK STOP

(71) Applicant: QUALCOMM Incorporated, San Diego, CA (US)

(72) Inventors: Abhijeet Paul, Escondido, CA (US); Mishel Matloubian, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 219 days.

(21) Appl. No.: 17/002,643

(22) Filed: Aug. 25, 2020

(65) Prior Publication Data
US 2021/0327826 A1   Oct. 21, 2021

Related U.S. Application Data

(60) Provisional application No. 63/010,554, filed on Apr. 15, 2020.

(51) Int. Cl.
*H01L 23/00* (2006.01)
*H01L 21/74* (2006.01)
*H01L 23/58* (2006.01)

(52) U.S. Cl.
CPC ............ *H01L 23/562* (2013.01); *H01L 21/74* (2013.01); *H01L 23/585* (2013.01)

(58) Field of Classification Search
None
See application file for complete search history.

(56) References Cited

U.S. PATENT DOCUMENTS

| | | | | |
|---|---|---|---|---|
| 10,714,411 B2* | 7/2020 | Sauter | ........................ | H01L 24/06 |
| 2009/0294897 A1* | 12/2009 | Lee | ........................ | H01L 23/585 |
| | | | | 257/509 |
| 2016/0013138 A1* | 1/2016 | Chen | ........................ | H01L 25/50 |
| | | | | 257/774 |
| 2019/0164911 A1* | 5/2019 | Pan | ........................ | H01L 21/765 |
| 2019/0348376 A1* | 11/2019 | Yang | ........................ | H01L 23/585 |

OTHER PUBLICATIONS

International Search Report and Written Opinion—PCT/US2021/027334—ISA/EPO—dated Jul. 23, 2021.

* cited by examiner

*Primary Examiner* — Michelle Mandala
*Assistant Examiner* — Jordan M Klein
(74) *Attorney, Agent, or Firm* — Loza & Loza, LLP

(57) ABSTRACT

An integrated device that includes a substrate, a circuit region located over the substrate, a design keep out region located over the substrate, and a periphery structure located over the substrate. The design keep out region laterally surrounds the circuit region. The periphery structure includes a first plurality of interconnects that laterally surrounds the design keep out region. The periphery structure is configured to operate as an electrical seal ring and a mechanical crack stop.

24 Claims, 24 Drawing Sheets

PLAN VIEW

PLAN VIEW

PLAN VIEW

PLAN VIEW

SIDE PROFILE VIEW

SIDE PROFILE VIEW

SIDE PROFILE VIEW

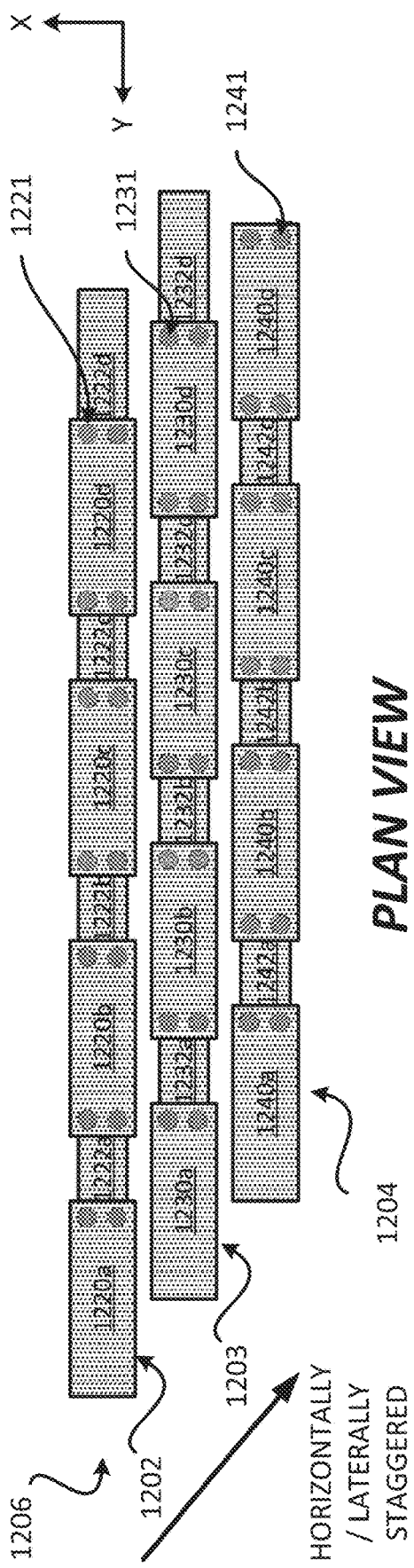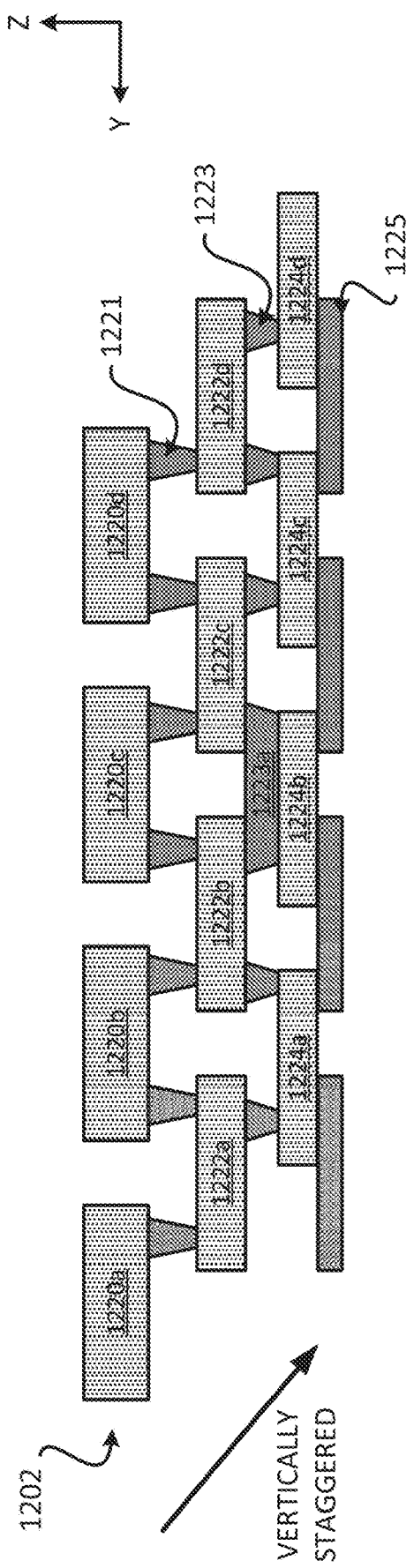

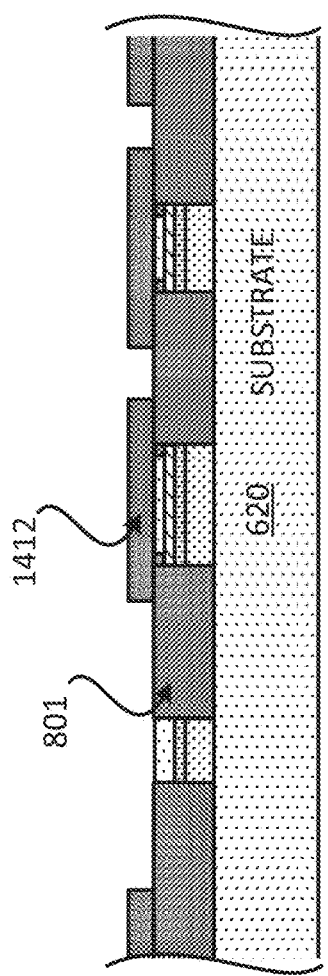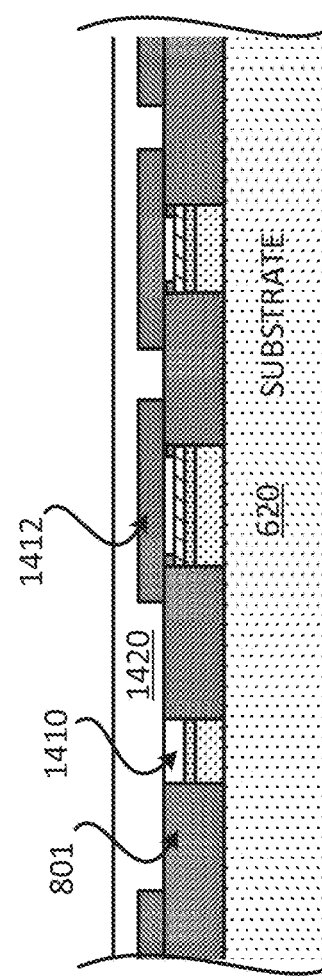
FIG. 14C

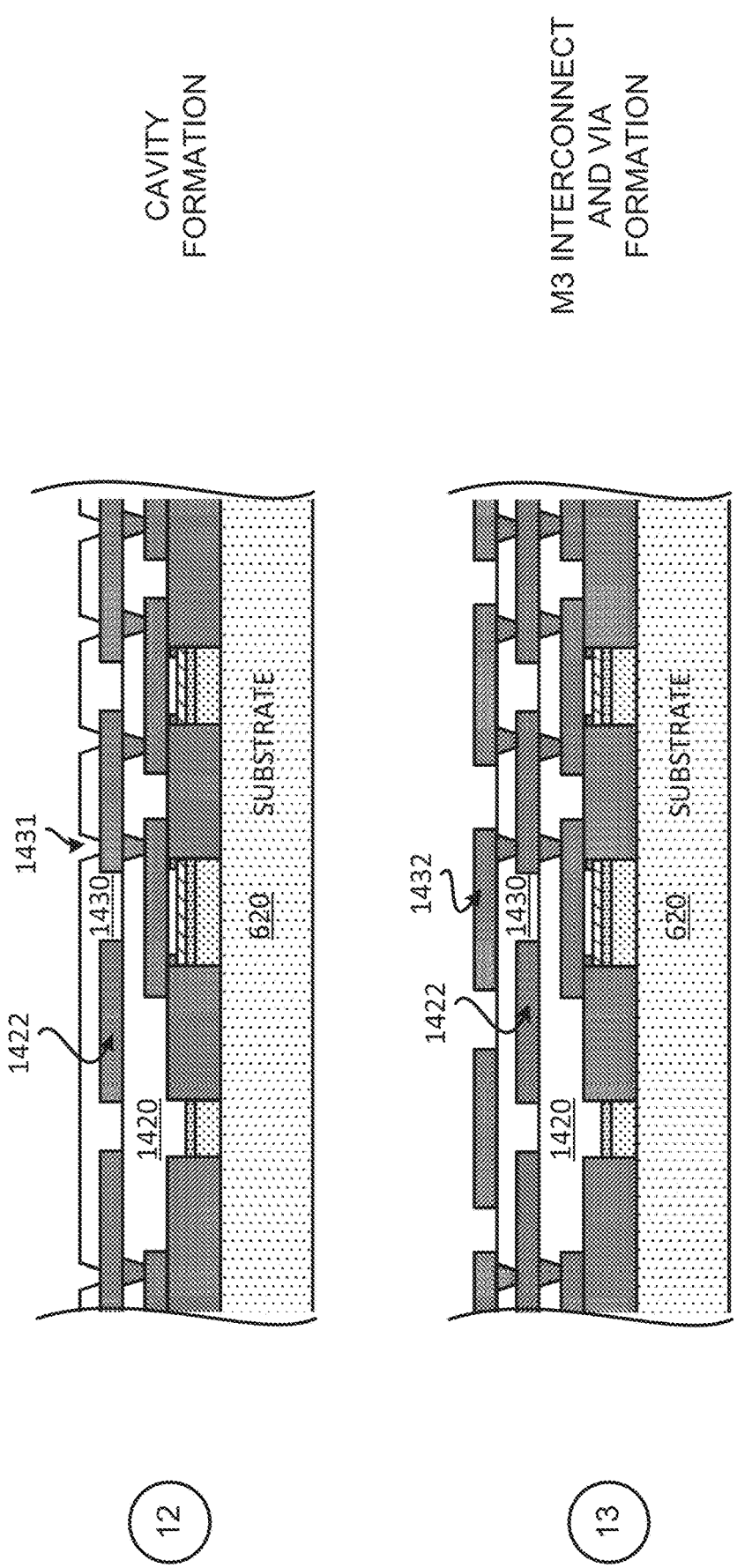

INTEGRATED DEVICE COMPRISING PERIPHERY STRUCTURE CONFIGURED AS AN ELECTRICAL GUARD RING AND A CRACK STOP

CROSS-REFERENCE/CLAIM OF PRIORITY TO RELATED APPLICATION

The present application claims priority to and the benefit of U.S. Provisional Application No. 63/010,554, filed on Apr. 15, 2020, and titled, "INTEGRATED DEVICE COMPRISING PERIPHERY STRUCTURE CONFIGURED AS AN ELECTRICAL GUARD RING AND A CRACK STOP", which is hereby expressly incorporated by reference.

FIELD

Various features relate to an integrated device, but more specifically to an integrated device that includes a periphery structure configured as an electrical guard ring and a crack stop.

BACKGROUND

FIG. 1 illustrates a package 100 that includes a substrate 102 and an integrated device 104. The substrate 102 includes at least one dielectric layer 120 and a plurality of interconnects 122. A plurality of solder interconnects 144 is coupled to the substrate 102 and the integrated device 104. A plurality of solder interconnects 124 is coupled to the substrate 102. During a coupling of the integrated device 104 to the substrate 102, the integrated device 104 may be subject to a lot of mechanical stress, which can cause the integrated device 104 to break and/or fail. There is an ongoing need to provide reliable integrated devices.

SUMMARY

Various features relate to an integrated device, but more specifically to an integrated device that includes a periphery structure configured as an electrical guard ring and a mechanical crack stop.

One example provides an integrated device that includes a substrate, a circuit region located over the substrate, a design keep out region located over the substrate, and a periphery structure located over the substrate. The design keep out region laterally surrounds the circuit region. The periphery structure includes a first plurality of protection interconnects that laterally surrounds the design keep out region. The periphery structure is configured to operate as an electrical seal ring and a mechanical crack stop.

Another example provides an apparatus that includes a substrate, a circuit region located over the substrate, a design keep out region located over the substrate, and means for periphery protection that laterally surrounds the design keep out region. The design keep out region laterally surrounds the circuit region. The means for periphery protection is configured to operate as an electrical seal ring and a mechanical crack stop.

Another example provides a method that includes providing a substrate. The method forms a circuit region over the substrate such that there is a design keep out region located over the substrate, where the design keep out region laterally surrounds the circuit region. The method forms a periphery structure over the substrate, the periphery structure comprises a first plurality of protection interconnects that laterally surrounds the design keep out region, where the periphery structure is configured to operate as an electrical seal ring and a mechanical crack stop.

BRIEF DESCRIPTION OF THE DRAWINGS

Various features, nature and advantages may become apparent from the detailed description set forth below when taken in conjunction with the drawings in which like reference characters identify correspondingly throughout.

FIG. 12 illustrates a plan view of a periphery structure that includes a plurality of interconnects configured to operate as an electrical seal ring and a crack stop.

FIG. 13 illustrates a profile view of a periphery structure that includes a plurality of interconnects configured to operate as an electrical seal ring and a crack stop.

FIGS. 14A-14G illustrate an exemplary sequence for fabricating a periphery structure configured to operate as an electrical seal ring and a mechanical crack stop.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes an integrated device (e.g., integrated circuit die) that includes a substrate, a circuit region located over the substrate, a design keep out region located over the substrate, and a periphery structure located over the substrate. The design keep out region laterally surrounds the circuit region. The periphery structure includes a first plurality of protection interconnects that laterally surround the design keep out region. The periphery structure is configured to operate as an electrical seal ring and a mechanical crack stop. The first plurality of protection interconnects may be vertically staggered. The periphery structure may further include a second plurality of protection interconnects that laterally surrounds the first plurality of protection interconnects. The second plurality of protection interconnects may be laterally staggered to the first plurality of protection interconnects. The first plurality of protection interconnects may be configured to be coupled to ground. The periphery structure may be implemented in the interconnect portion of the integrated device. The periphery structure may be a component that provides at least two functionalities, namely, an electrical seal ring and a mechanical crack stop for the integrated device. That is, the periphery structure may be configured to (i) prevent signals from external devices from interfering with active circuits of the circuit region, and/or (ii) prevent cracks from propagating into the design keep out region and the circuit region of the integrated device. Moreover, the location of the periphery structure provides a more efficient use of the space in an integrated device, resulting in a more compact integrated device, which in turn allows more integrated devices to be fabricated per wafer.

Exemplary Integrated Device Comprising a Periphery Structure

Figure 1:
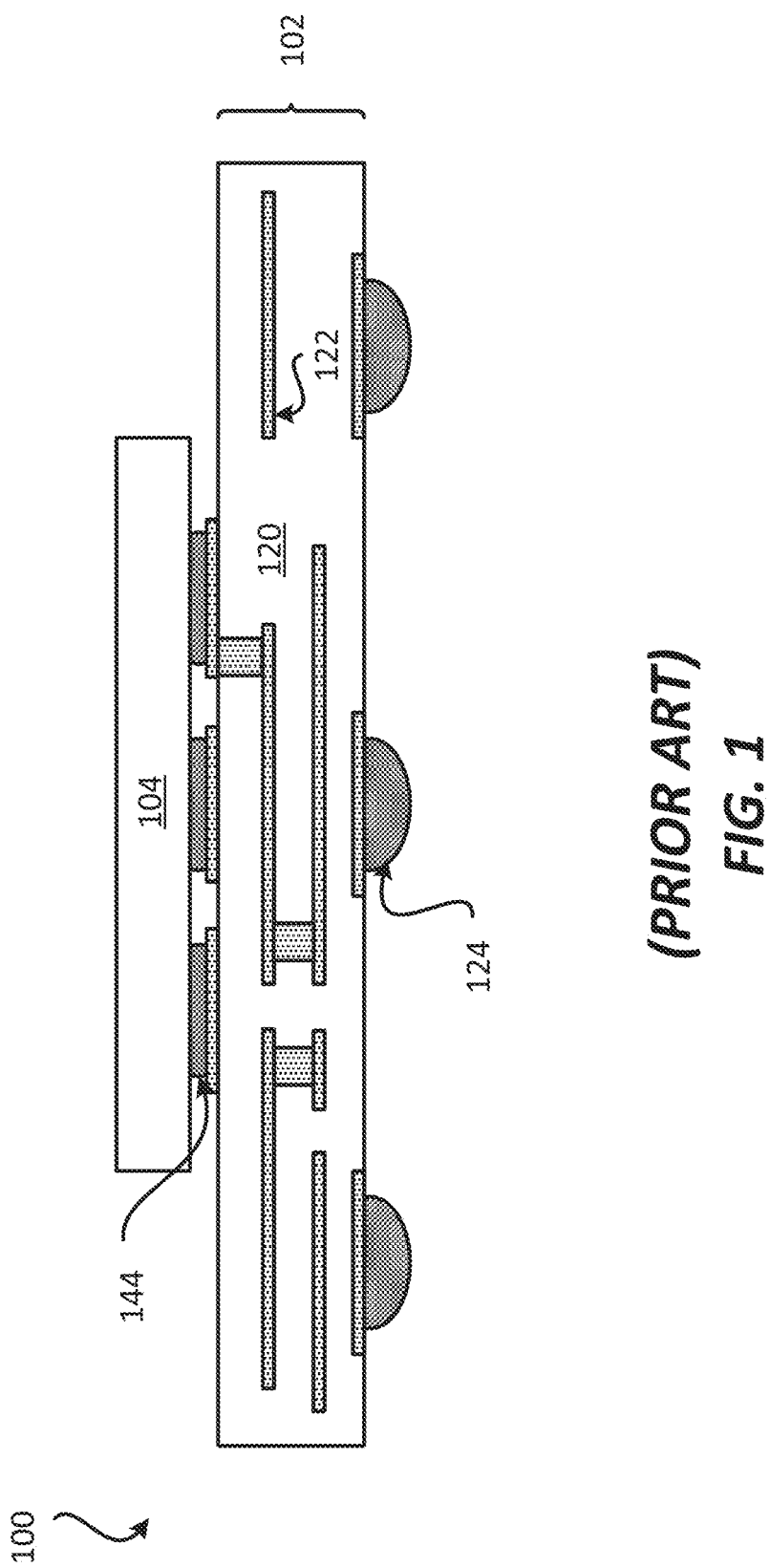
FIG. 1 illustrates a profile view of a package that includes an integrated device and a substrate.
Figure 2:
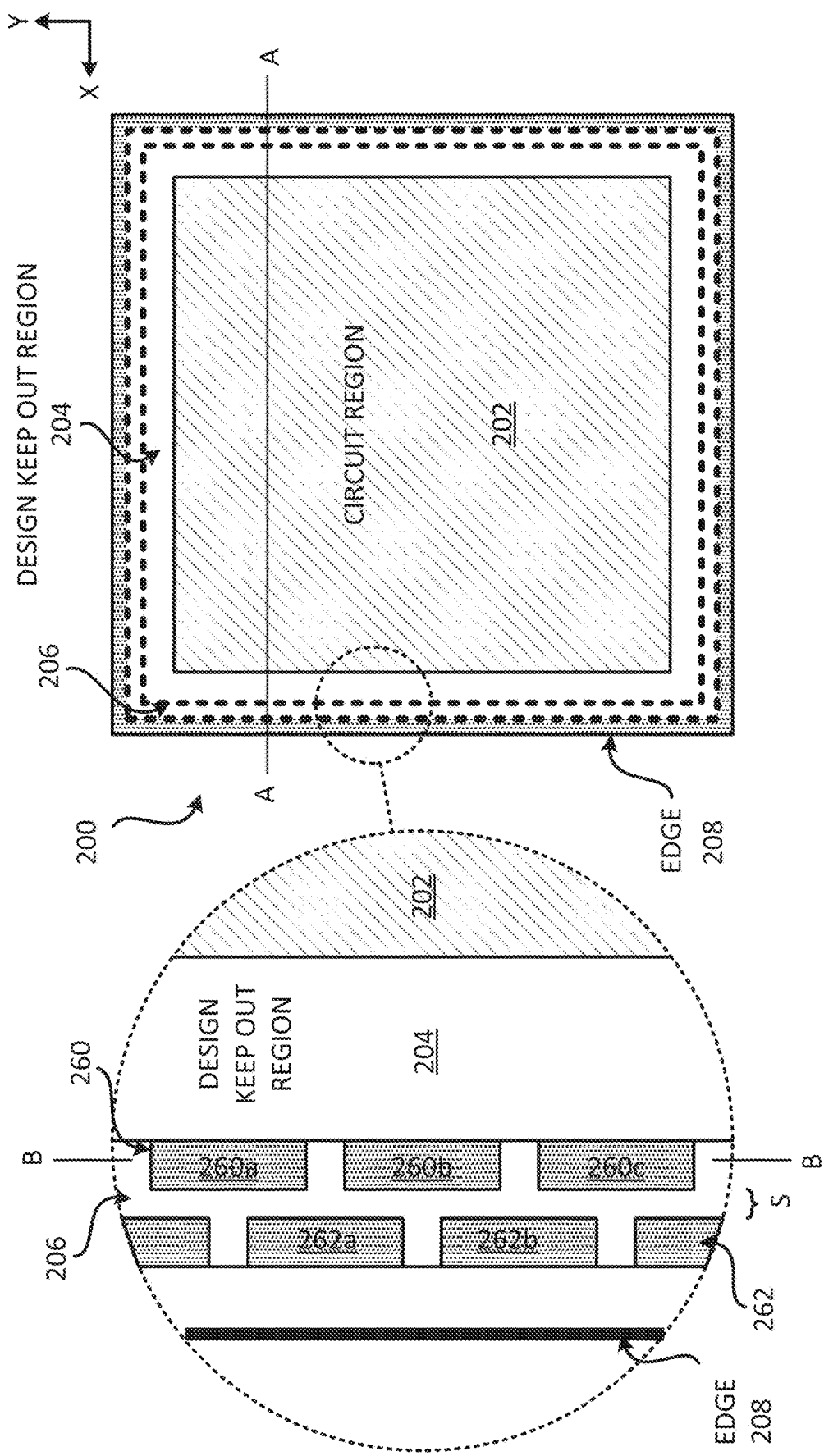
FIG. 2 illustrates a plan view of an integrated device that includes a periphery structure configured to operate as an electrical seal ring and a crack stop.

FIG. 2 illustrates a plan view of on an integrated device 200 that includes a periphery structure 206. As will be further described below, the periphery structure 206 may be configured as an electrical seal ring and a mechanical crack stop for the integrated device 200. The periphery structure 206 may be a protective periphery structure. The periphery structure 206 may be a means for periphery protection. The integrated device 200 may include a die (e.g., integrated circuit die, semiconductor bare die).

The integrated device 200 includes a substrate (not visible), a circuit region 202 formed and located over the substrate, a design keep out region 204 formed and located over the substrate, and the periphery structure 206 formed and located over the substrate.

The circuit region 202 may be a region of the integrated device 200 that includes circuit components, such as active devices and passive devices. The circuit region 202 may include active devices such as at least one transistor. The active devices may be formed in a front end of line (FEOL) portion of the integrated device 200. The circuit region 202 may include a plurality of interconnects. The plurality of interconnects may be configured to be electrically coupled active devices and/or passive devices. The plurality of interconnects may be formed on the interconnect portion or a back end of line (BEOL) portion of the integrated device 200, which is further described below in at least FIGS. 6 and 7.

The design keep out region 204 laterally surrounds the circuit region 202. The design keep out region 204 may be a region over the substrate that is free of any active devices and/or passive devices. The design keep out region 204 may be a region over the substrate that is free of interconnects. The design keep out region 204 may be a region over the substrate that is free of any active devices (e.g., transistor), passive devices (e.g., inductor, capacitor) and interconnects. The design keep out region 204 may be a region over the substrate (e.g., 620) that is free of a periphery structure (e.g., 206). The design keep out region 204 may be a region over the substrate that is free of interconnects that are configured to be electrically coupled to active devices and/or passive devices of an integrated device. Thus, the design keep out region 204 may not include interconnects that are configured to be electrically coupled to active devices and/or passive devices of an integrated device. However, the design keep-out region 204 may include at least one interconnect that is coupled to a periphery structure (e.g., 206), but the at least one interconnect may be configured to not be electrically coupled to an active device (e.g., transistor) and/or a passive device (e.g., inductor, capacitor) of the integrated device. The design keep out region 204 may be a region over the substrate (e.g., 620) that is free of a periphery structure (e.g., 206). The design keep out region 204 may include at least one dielectric layer. The design keep out region 204 may be a continuous region and/or contiguous region over the substrate. The design keep out region 204 may be is used to optically inspect the integrated device 200 for cracks. In some implementations, when the design keep out region 204 includes at least one crack, the integrated device 200 may be considered defective and may be discarded. When there is no crack in the design keep out region 204, the integrated device 200 may pass optical inspection.

The periphery structure 206 laterally surrounds the design keep out region 204 and the circuit region 202. The periphery structure 206 includes a first plurality of protection interconnects 260 (e.g., 260a, 260b, 260c) that laterally surround the design keep out region 204 and the circuit region 202. The periphery structure 206 may also include a second plurality of protection interconnects 262 (e.g., 262a, 262b) that laterally surround the design keep out region 204 and the circuit region 202. The second plurality of protection interconnects 262 laterally surrounds the first plurality of protection interconnects 260. The second plurality of protection interconnects 262 may be laterally staggered from the first plurality of protection interconnects 260. The first plurality of protection interconnects 260 and the second plurality of protection interconnects 262 may each be arranged in a dashed pattern on at least one particular metal layer of the integrated device. The first plurality of protection interconnects 260 and the second plurality of protection interconnects 262 may each be arranged in rows (and/or columns) of protection interconnects that are dashed. The row of protection interconnects from the first plurality of protection interconnects 260 may be laterally staggered from the row of protection interconnects from the second plurality of protection interconnects 262. The second plurality of protection interconnects 262 may be laterally spaced apart from the first plurality of protection interconnects 260.

Different implementations may have different spacing (S) between the second plurality of protection interconnects 262 and the first plurality of protection interconnects 260. In some implementations, the second plurality of protection interconnects 262 and the first plurality of protection interconnects 260 may be laterally spaced apart by approximately 3-4 micrometers (μm) or less. More detailed examples of the periphery structure are further illustrated and described below in at least FIGS. 8-13.

FIG. 2 illustrates one metal layer of the first plurality of protection interconnects 260 and the second plurality of protection interconnects 262. However, the first plurality of protection interconnects 260 and the second plurality of protection interconnects 262 may be formed on more than one metal layer (e.g., M1, M2, M3, M4, M5, M6, M7, M8, M9) of the integrated device 200. The first plurality of protection interconnects 260 and the second plurality of protection interconnects 262 may also include vias (e.g., via bars) that couple the interconnects on various metal layers of the integrated device 200. Thus, the first plurality of protection interconnects 260 and the second plurality of protection interconnects 262 may each include traces and/or pads located on at least one metal layer and/or vias located between metal layers of the integrated device 200. The design and/or configuration of the first plurality of protection interconnects 260 and the second plurality of protection interconnects 262 may vary with different implementations. As will be further described below, in some implementations, at least some of the protection interconnects from the first plurality of protection interconnects 260 and/or the second plurality of protection interconnects 262 may be coupled to ground. The first plurality of protection interconnects 260 and the second plurality of protection interconnects 262 may be formed on the interconnect portion or back end of line (BEOL) portion of the integrated device 200, which is further described below in at least FIGS. 6 and 7.

Figure 6:
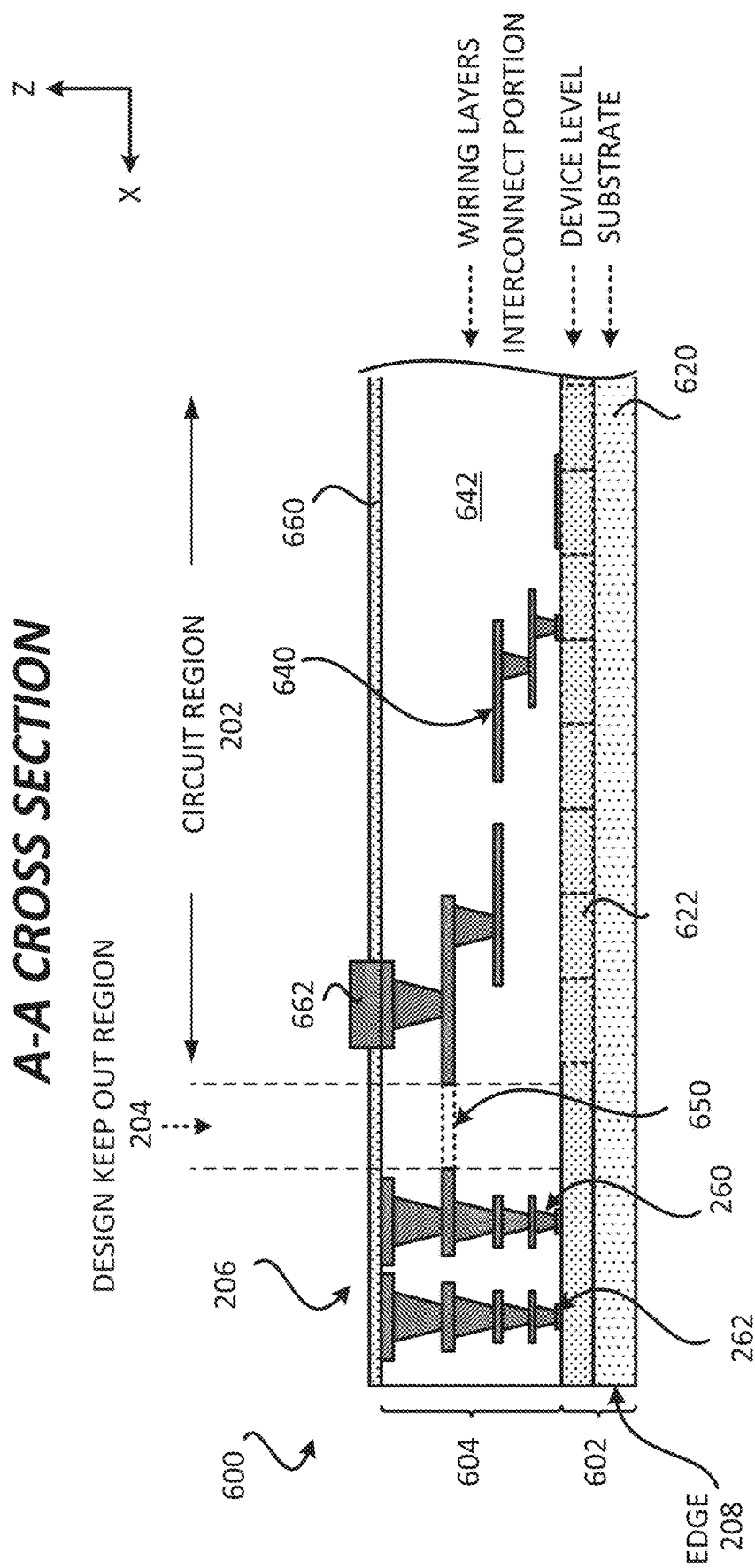
FIG. 6 illustrates a profile view of an integrated device that includes a periphery structure configured to operate as an electrical seal ring and a crack stop.
Figure 7:
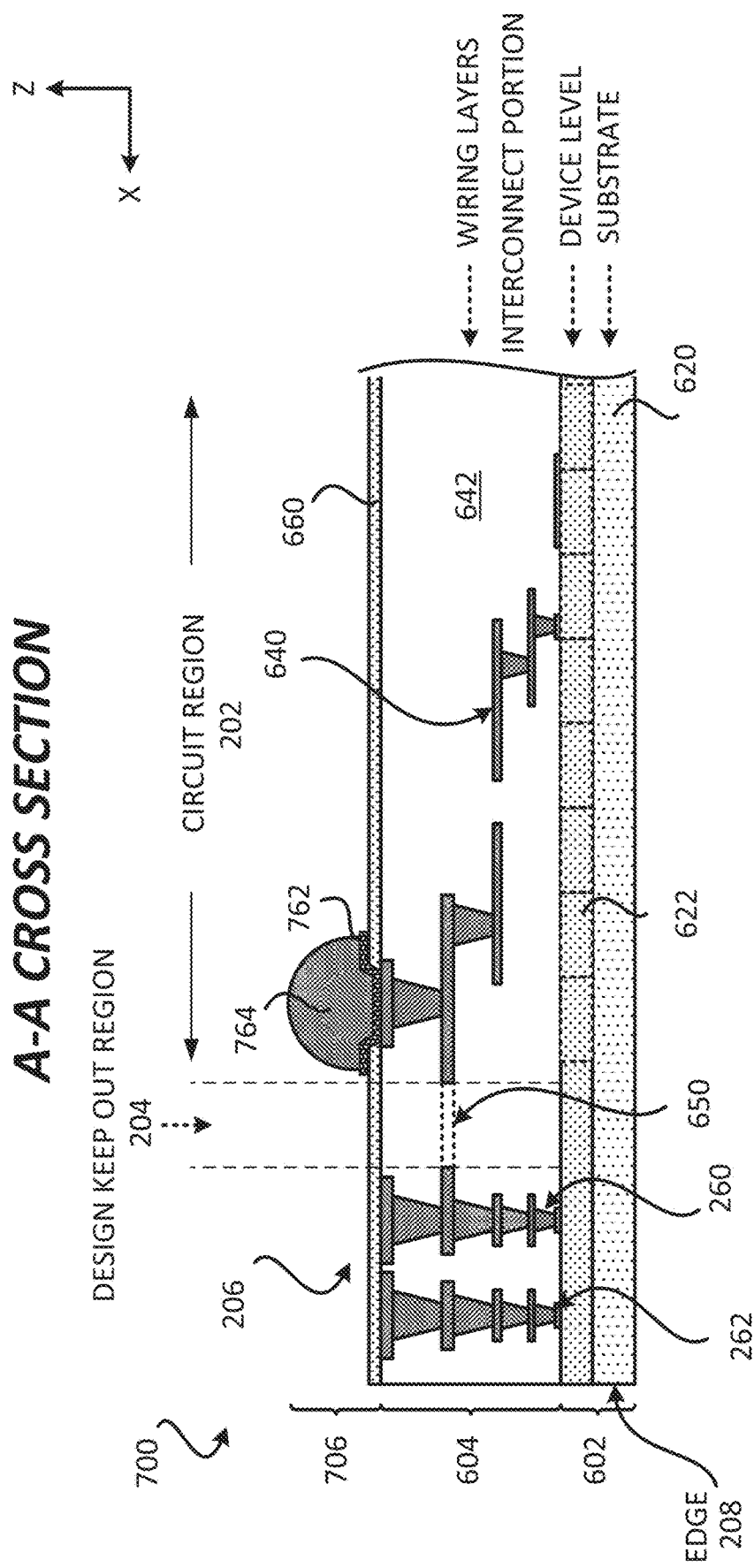
FIG. 7 illustrates a profile view of an integrated device that includes another periphery structure configured to operate as an electrical seal ring and a crack stop.

As mentioned above, the periphery structure 206 is configured to operate as an electrical seal ring and a crack stop for the integrated device 200. Thus, first plurality of protection interconnects 260 and/or the second plurality of protection interconnects 262, individually or collectively, may be configured to operate as an electrical seal ring and a crack stop (e.g., mechanical crack stop) for the integrated device 200. The periphery structure 206 may be configured as an electrical seal ring by providing isolation for active circuits (e.g., active devices) in the circuit region 202 from external signals, such as signals from other integrated devices. Thus, the periphery structure 206 configured as an electrical seal ring helps reduce and/or eliminate cross talk that may happen with other external components that are near the integrated device 200. To further increase the effectiveness of the periphery structure 206 as an electrical seal ring, the periphery structure 206 may be coupled to ground. In such an instance, the periphery structure 206 may be coupled to a ground pin and/or solder interconnect that is configured to be coupled to ground (e.g., externally grounded, grounded separately from the active devices of the circuit region 202). FIGS. 6 and 7 illustrate how the periphery structure 206 may be coupled to ground. The periphery structure 206 may be configured to prevent cracks from propagating into the design keep out region 204 and the circuit region 202. In some implementations, either the first plurality of protection interconnects 260 or the second plurality of protection interconnects 262 may provide additional electrical seal ring functionality and/or additional crack stopping functionality for the integrated device 200. The periphery structure 206 may be located offset from an edge 208 of the integrated device 200. Different implementations may position the periphery structure 206 differently from the edge 208 of the integrated device 200. In some implementations, at least some portion of the periphery structure 206 may be approximately 15 micrometers (μm) or less from the edge 208 (e.g., 10-15 μm). The edge 208 may define the physical lateral boundaries of the integrated device 200.

The periphery structure 206 provides multiple functionalities and advantages for the integrated device 200. Moreover, the location of the periphery structure 206 is such that the design keep out region 204 is located between the circuit region 202 and the periphery structure 206. Such a location for the periphery structure 206 provides and enables a more efficient use of the space for the integrated device 200. That is, the design of the integrated device 200 reduces wasted space, which may help reduce the size and/or cost of the integrated device 200. In some implementations, there may be a savings of approximately 8-20% in integrated device size, which means that more integrated devices may be fabricated in a wafer of similar size. This in turn, may reduce the cost of fabricating each integrated device.

Figure 3:
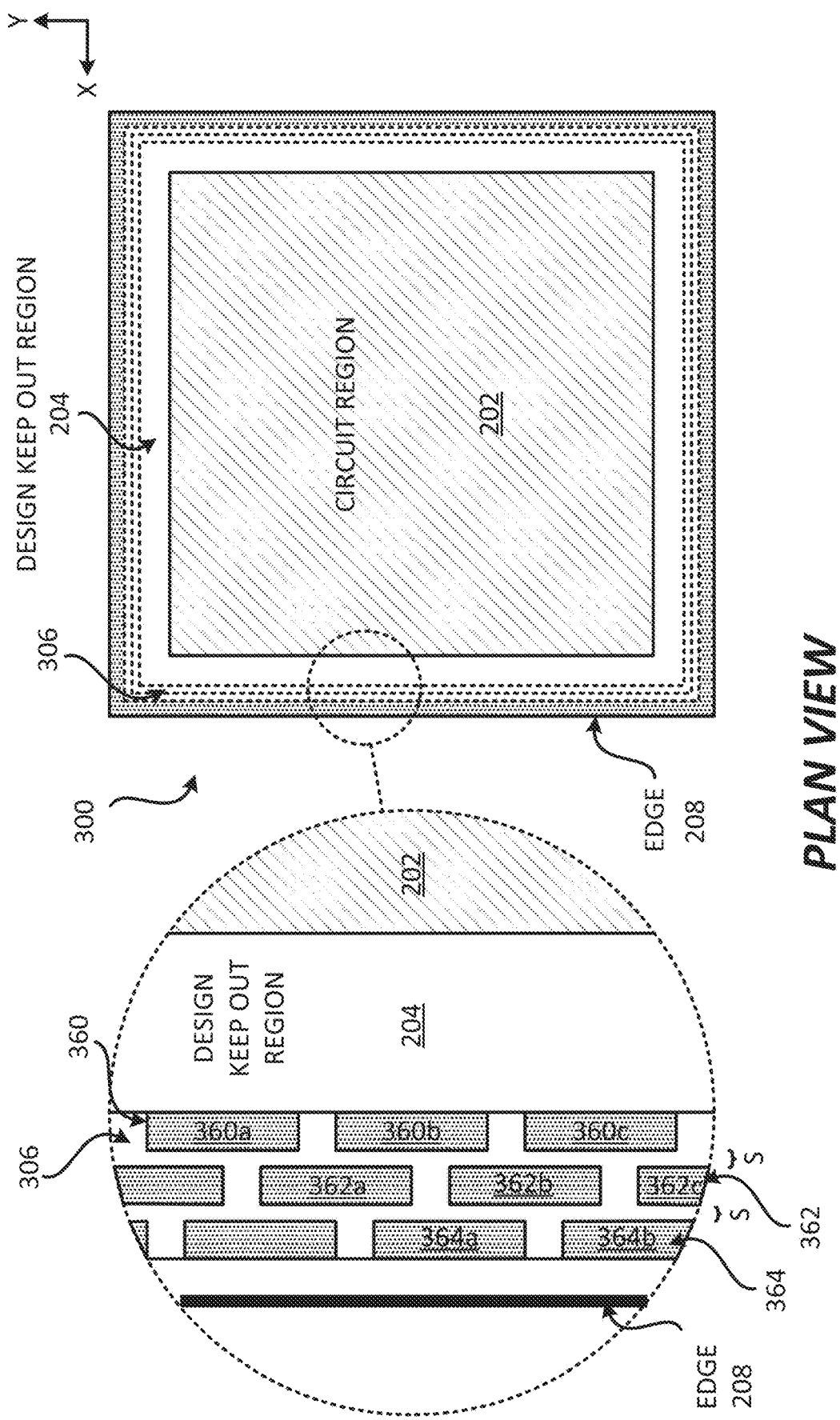
FIG. 3 illustrates a plan view of an integrated device that includes another periphery structure configured to operate as an electrical seal ring and a crack stop.

FIG. 3 illustrates an integrated device 300 that includes a periphery structure 306 that is configured to operate as an electrical seal ring and a mechanical crack stop for the integrated device. The integrated device 300 may be similar to the integrated device 200 of FIG. 2, and thus may include the same or similar components as the integrated device 200. The integrated device 300 includes a substrate (not visible), the circuit region 202 formed and located over the substrate, the design keep out region 204 formed and located over the substrate, and the periphery structure 306 formed and located over the substrate. The periphery structure 306 may be a means for periphery protection. The integrated device 300 may include a die. The integrated device 300 includes the edge 208 that defines the physical lateral boundaries of the integrated device 300.

As shown in FIG. 3, the periphery structure 306 includes a first plurality of protection interconnects 360 (e.g., 360a, 360b, 360c), a second plurality of protection interconnects 362 (e.g., 363a, 363b, 362c) and a third plurality of protection interconnects 364 (e.g., 364a, 364b). The first plurality of protection interconnects 360, the second plurality of protection interconnects 362 and the third plurality of protection interconnects 364 may be similar in design, shape and/or size as the first plurality of protection interconnects 260 and/or the second plurality of protection interconnects 262.

The periphery structure 306 laterally surrounds the design keep out region 204 and the circuit region 202. The first plurality of protection interconnects 360, the second plurality of protection interconnects 362 and the third plurality of protection interconnects 364 laterally surround the design keep out region 204 and the circuit region 202. The third plurality of protection interconnects 364 laterally surrounds the second plurality of protection interconnects 362. The second plurality of protection interconnects 362 laterally surrounds the first plurality of protection interconnects 360.

The first plurality of protection interconnects 360, the second plurality of protection interconnects 362 and the third plurality of protection interconnects 364 may each be arranged in a dashed pattern on at least one particular metal layer of the integrated device. The second plurality of protection interconnects 362 may be laterally staggered from the first plurality of protection interconnects 360. The third plurality of protection interconnects 364 laterally surrounds the second plurality of protection interconnects 362. The third plurality of protection interconnects 364 may be laterally staggered from the second plurality of protection interconnects 362. The first plurality of protection interconnects 360, the second plurality of protection interconnects 362 and the third plurality of protection interconnects 364 may each be arranged in rows (and/or columns) of protection interconnects. The row of protection interconnects from the first plurality of protection interconnects 360 may be laterally staggered from the row of protection interconnects from the second plurality of protection interconnects 362. The row of protection interconnects from the second plurality of protection interconnects 362 may be laterally staggered from the row of protection interconnects from the third plurality of protection interconnects 364. The second plurality of protection interconnects 362 may be laterally spaced apart from the first plurality of protection interconnects 360. The third plurality of protection interconnects 364 may be laterally spaced apart from the second plurality of protection interconnects 362. Different implementations may have different spacing between (i) the second plurality of protection interconnects 362 and the first plurality of protection interconnects 360, and (ii) the third plurality of protection interconnects 364 and the second plurality of protection interconnects 362. In some implementations, the second plurality of protection interconnects 362 and the first plurality of protection interconnects 360 may be laterally spaced apart by approximately 3-4 micrometers ($\mu m$) or less. In some implementations, the third plurality of protection interconnects 364 and the second plurality of protection interconnects 362 may be laterally spaced apart by approximately 3-4 micrometers ($\mu m$) or less. Different implementations may have similar or different widths for the protection interconnects described in the disclosure. Moreover, different implementations may have similar or different widths across different metal layers and/or vias of the protection interconnects. A protection interconnect may have a width that is approximately 9 micrometers ($\mu m$) or less. More detailed examples of the periphery structure are further illustrated and described below in at least FIGS. 8-13.

Figure 4:
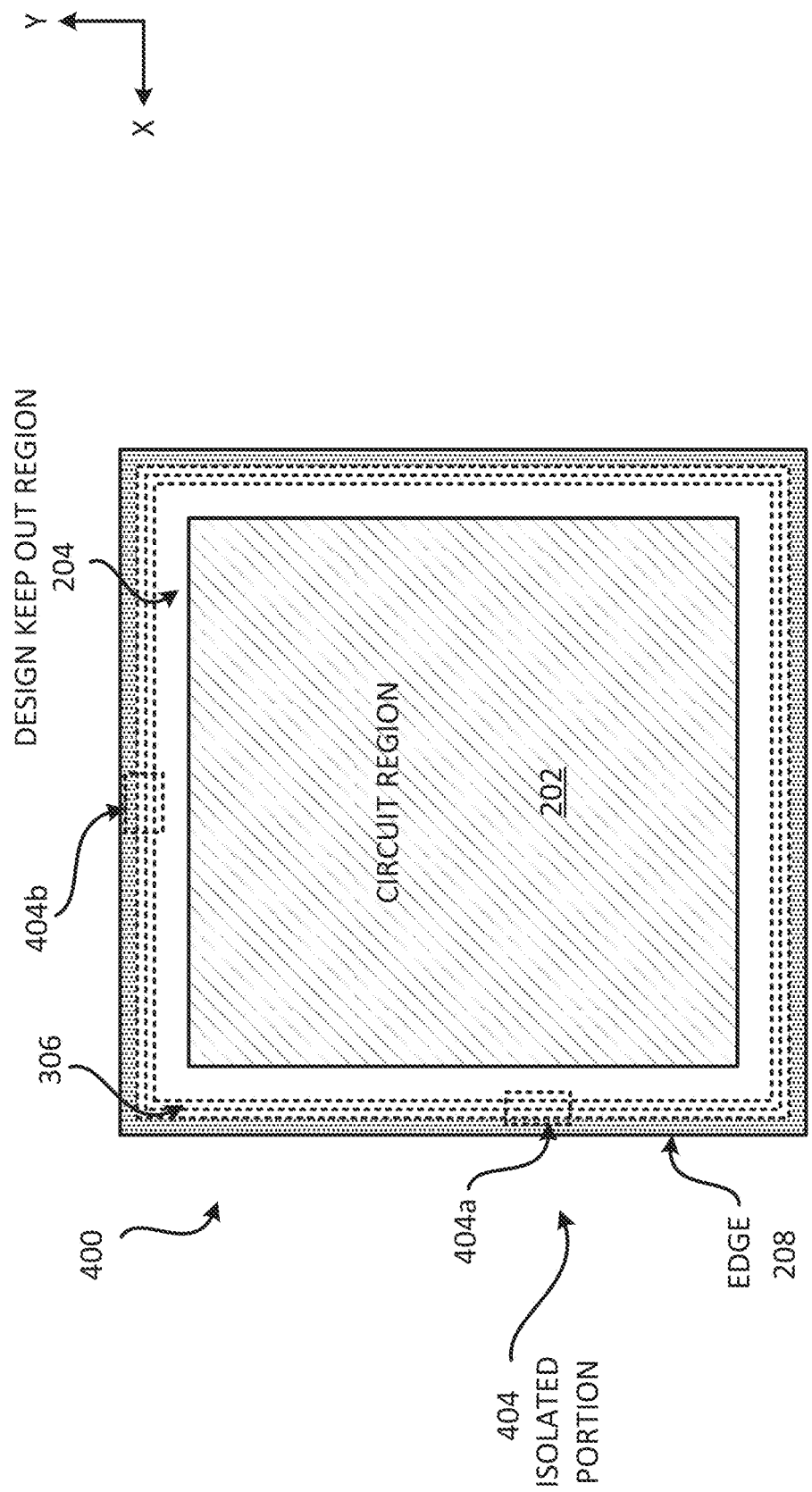
FIG. 4 illustrates a plan view of an integrated device that includes another periphery structure configured to operate as an electrical seal ring and a crack stop.

FIG. 4 illustrates an integrated device 400 that includes a periphery structure 306. The integrated device 400 may be similar to the integrated device 300 of FIG. 3, and thus may include the same or similar components as the integrated device 300. The integrated device 400 includes a substrate (not visible), the circuit region 202 formed and located over the substrate, the design keep out region 204 formed and located over the substrate, and the periphery structure 306 formed and located over the substrate. The periphery structure 306 may be a means for periphery protection. The integrated device 400 may include a die. The integrated device 400 includes the edge 208 that defines the physical lateral boundaries of the integrated device 400.

As shown in FIG. 4, the periphery structure 306 includes a plurality of isolated portions 404 (e.g., isolated portion 404a, isolated portion 404b). An isolated portion (e.g., 404a, 404b) may be a portion of the periphery structure 306 where signals may travel through. Different implementations may have different numbers of isolated portions. The isolated portions may be located at different portions of the periphery structure 306. An isolated portion of the periphery structure 306 may include at least one protection interconnect that is configured to not be electrically coupled to other protection interconnects of the periphery structure 306, and/or at least one protection interconnect that is configured to not be electrically coupled to ground, when other protection interconnects are configured to be coupled to ground. For example, the isolated portion (e.g., 404a, 404b) may include at least one protection interconnects from the first plurality of protection interconnects 360, that is (i) configured to not be electrically coupled to other protection interconnects from the first plurality of protection interconnects 360 and/or (ii) configured to not be coupled to ground. Similarly, the isolated portion (e.g., 404a, 404b) may include at least one protection interconnects from the second plurality of protection interconnects 362, that is (i) configured to not be electrically coupled to other protection interconnects from the second plurality of protection interconnects 362 and/or (ii) configured to not be coupled to ground. Additionally, the isolated portion (e.g., 404a, 404b) may include at least one protection interconnects from the third plurality of protection interconnects 364, that is (i) configured to not be electrically coupled to other protection interconnects from the second plurality of protection interconnects 364 and/or (ii) configured to not be coupled to ground. Isolated portions will be further described and illustrated below in at least FIGS. 10-11.

Figure 5:
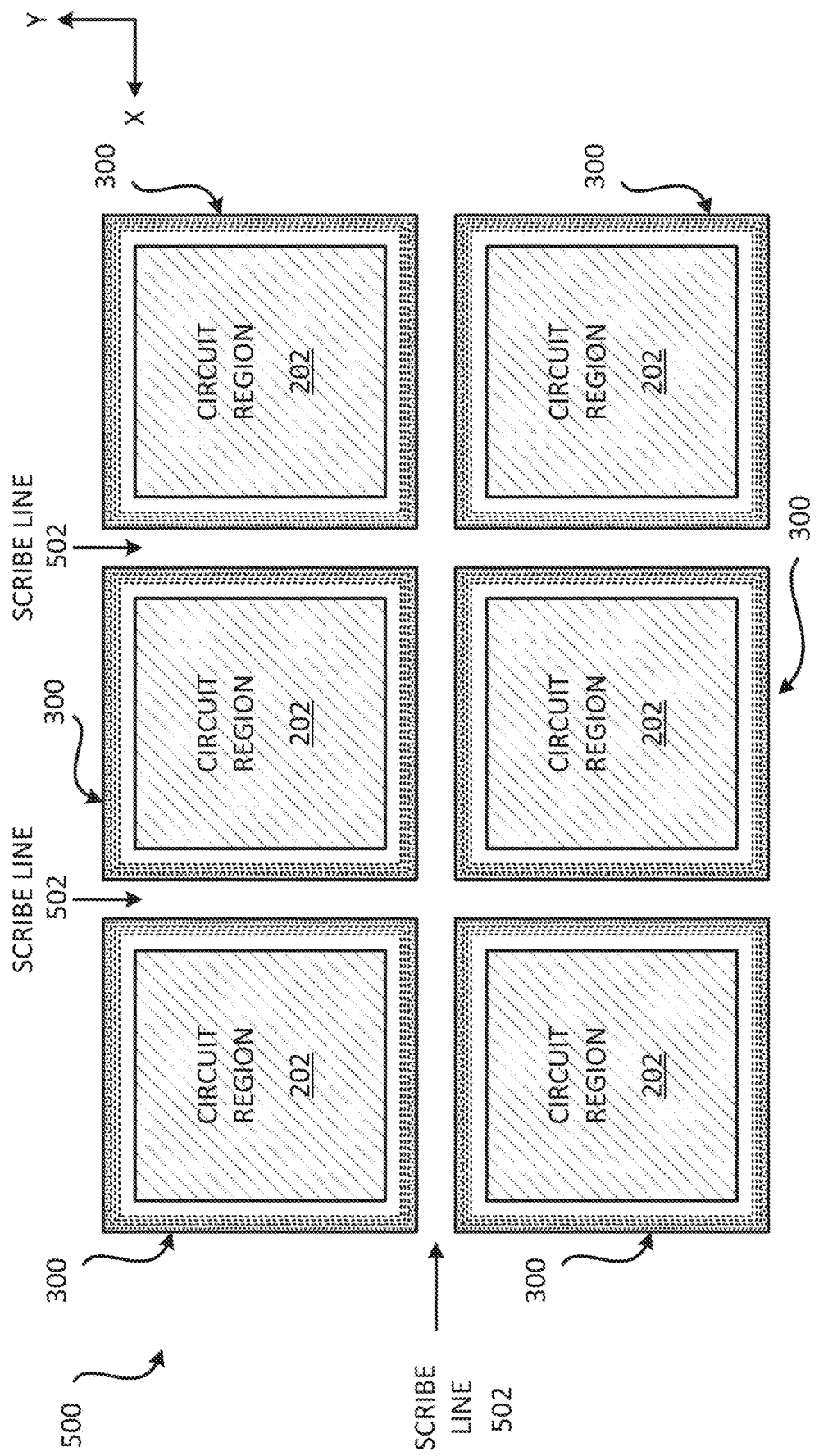
FIG. 5 illustrates a plan view of a wafer that includes a plurality of integrated devices that each includes a periphery structure configured to operate as an electrical seal ring and a crack stop.

FIG. 5 illustrates portions of a wafer 500 that has been cut (e.g., diced) into a plurality of integrated device 300 (e.g., dies) along the scribe lines 502. As shown in FIG. 5, the scribe lines 502 are located adjacent to the periphery structure 306 of each respective integrated device 300. As mentioned above, forming the periphery structure 306 such that the periphery structure 306 laterally surrounds the design keep out region 204 and the circuit region 202, helps reduce and/or optimize the size of the integrated device 300. There may be a savings of approximately 8-20% in integrated device size, which means that more integrated devices may be fabricated in a wafer of similar size. This in turn, may reduce the cost of fabricating each integrated device.

Exemplary Integrated Device Comprising a Periphery Structure

FIG. 6 illustrates a profile view of an integrated device 600 that includes a periphery structure. The integrated device 600 may include a die. The integrated device 600 may represent a cross section A-A of the integrated device 200 of FIG. 2. The integrated device 600 includes a substrate 620, a plurality of device level cells 622 (e.g., logic cells), an interconnect portion 604, the circuit region 202, the design keep out region 204, the periphery structure 206 and the edge 208.

The plurality of device level cells 622 is formed over the substrate 620. The plurality of device level cells 622 may form the device level layer of the integrated device 600. In some implementations, the plurality of device level cells 622 may include portions of the substrate 620. In some implementations, the substrate 620, the device level layer and the plurality of device level cells 622 may be referred as the substrate portion 602 of the integrated device 600.

The plurality of device level cells 622 may include one or more transistors. A transistor may include a gate, a source, and a drain. A gate contact may be formed over the gate. A source contact may be formed over the source. A drain contact may be formed over the drain. A contact may be configured to be electrically coupled to an interconnect (e.g., interconnect of M1 metal layer) of an integrated device. For example, a gate contact may be configured to be electrically coupled to a contact interconnect, which is coupled to a M1 layer interconnect.

The interconnect portion 604 is coupled to and formed over the substrate portion 602. In particular, the interconnect portion 604 is formed over the plurality of device level cells 622. The interconnect portion 604 includes wiring layers. The interconnect portion 604 includes a plurality of interconnects 640 (e.g., trace, pad, vias) and at least one dielectric layer 642. The interconnect portion 604 may provide interconnects to the plurality of transistors of the device level cells. The M1 layer interconnect may be part of the interconnect portion 1604. The interconnect portion 604 may include other metal layers (e.g. M2 layer interconnect, M3 layer interconnect, M4 layer interconnect, etc. . . . ). Different implementations may have a different number of metal layers (e.g., M1, M2, M3, M4, M5, etc. . . . ) for the interconnect portion 604. A passivation layer 660 may be formed and located over the interconnect portion 604. At least one pad 662 may be coupled to the plurality of interconnects 640.

As shown in FIG. 6, the circuit region 202, the design keep out region 204 and the periphery structure 206 are formed and located over the substrate 620. The circuit region 202 may be a region of the integrated device 600 that includes circuit components. For example, the circuit region 202 may include the device level cells 622, which may include at least one transistor. The circuit region 202 may also include the plurality of interconnects 640 and the at least one pad 662. The plurality of interconnects 640 may be configured to electrically couple active devices and/or passive devices. The plurality of interconnects 640 may be formed on a back end of line (BEOL) portion of the integrated device 600.

The design keep out region 204 may be a region over the substrate 620 that is free of any active devices and/or passive devices. The design keep out region 204 may be a region over the substrate 620 that is free of interconnects (e.g., free of the plurality of interconnects 640). The design keep out region 204 may be a region over the substrate 620 that is free of any active devices, passive devices and interconnects. The design keep out region 204 may be a region over the substrate 620 that is free of a periphery structure (e.g., 206). The design keep out region 204 may be a region over the substrate (e.g., 620) that is free of a periphery structure (e.g., 206). The design keep out region 204 may be a region over the substrate that is free of interconnects that are configured to be electrically coupled to active devices and/or passive devices of an integrated device. Thus, the design keep out region 204 may not include interconnects that are configured to be electrically coupled to active devices and/or passive devices of an integrated device. However, the design keep-out region 204 may include at least one interconnect that is coupled to a periphery structure (e.g., 206), but the at least one interconnect may be configured to not be electrically coupled to an active device (e.g., transistor) and/or a passive device (e.g., inductor, capacitor) of the integrated device. It is noted that the design keep out region 204 may include an interconnect 650 that is configured to be coupled to ground, but is free of any active devices and/or passive devices. In one example, the periphery structure 206 may be coupled to the interconnect 650, which is configured to be coupled to ground. The first plurality of protection interconnects 260 and/or the second plurality of protection interconnects 262 may be coupled to the interconnect 650. The first plurality of protection interconnects 260 may be coupled to the second plurality of protection interconnects 262. The interconnect 650 may be coupled to interconnects from the plurality of interconnects 640 that are configured to be coupled to ground (e.g., externally grounded, grounded separately from the active devices of the circuit region 202). The interconnect 650 may be configured to not be electrically coupled to an active device and/or a passive device of the integrated device 600. For example, the pad 662 may be considered as a pin that is coupled to ground, and the interconnect 650 is coupled to at least one interconnect that is coupled to the pad 662.

The periphery structure 206 includes the first plurality of protection interconnects 260 and the second plurality of protection interconnects 262. The first plurality of protection interconnects 260 and the second plurality of protection interconnects 262 include five (5) metal layers. However, different implementations of the first plurality of protection interconnects 260 and the second plurality of protection interconnects 262 may include different numbers of metal layers (e.g., at least one metal layer, more than 5 metal layers). The first plurality of protection interconnects 260 and the second plurality of protection interconnects 262 may be located at least in the interconnect portion 604. As further described below in at least FIG. 8, the periphery structure 206 may include substrate vias. Thus, part of the periphery structure 206 (and/or any periphery structure) may be located in and/or on a substrate (e.g., 620) of an integrated device.

FIG. 7 illustrates a profile view of an integrated device 700 that includes a periphery structure. The integrated device 600 may include a wafer level package (WLP). The integrated device 700 may represent a cross section A-A of the integrated device 200 of FIG. 2. The integrated device 700 may be similar to the integrated device 600 of FIG. 6, and thus may include the same or similar components as the integrated device 600. The integrated device 700 includes a substrate 620, a plurality of device level cells 622 (e.g., logic cells), the interconnect portion 604, and a packaging portion 706. The plurality of device level cells 622 is located and formed over the substrate 620. The plurality of device level cells 622 may form the device level layer of the integrated device 700. In some implementations, the plurality of device level cells 622 may include portions of the substrate 620. In some implementations, the substrate 620, the device level layer and the plurality of device level cells 622 may be referred as the substrate portion 602 of the integrated device 700.

The packaging portion 706 is formed over and coupled to the interconnect portion 604. The packaging portion 706 includes the passivation layer 660, an under bump metallization (UBM) layer 762 and a solder interconnect 764. It is noted that the size and shape of the integrated device 700 is exemplary. Moreover, the components of the integrated device 700 shown may not be to scale.

As mentioned above, the periphery structure 206 may be coupled to ground. In one example, the periphery structure 206 may be coupled to the interconnect 650, which is configured to be coupled to ground. The first plurality of protection interconnects 260 and/or the second plurality of protection interconnects 262 may be coupled to the interconnect 650. The first plurality of protection interconnects 260 may be coupled to the second plurality of protection interconnects 262. The interconnect 650 may be coupled to interconnects from the plurality of interconnects 640 that are configured to be coupled to ground (e.g., externally grounded, grounded separately from the active devices of the circuit region 202). For example, the UBM layer 762 and the solder interconnect 764 may be considered as a bump that is coupled to ground, and the interconnect 650 is coupled to at least one interconnect that is coupled to the UBM layer 762 and the solder interconnect 764.

An integrated device (e.g., 200, 300, 400, 600, 700) may include a die (e.g., bare die). The integrated device may include a radio frequency (RF) device, an analog device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a silicon (Si) based integrated device, a silicon carbide (SiC) based integrated device, a GaAs based integrated device, a GaN based integrated device, a memory, power management processor, and/or combinations thereof.

The integrated devices 600 and/or 700 may be implemented with the periphery structure 306. Thus, the integrated devices 600 and/or 700 may include a periphery structure 306 that includes the first plurality of protection interconnects 360, the second plurality of protection interconnects 362 and the third plurality of protection interconnects 364, as described in FIGS. 3 and/or 4.

Figure 8:
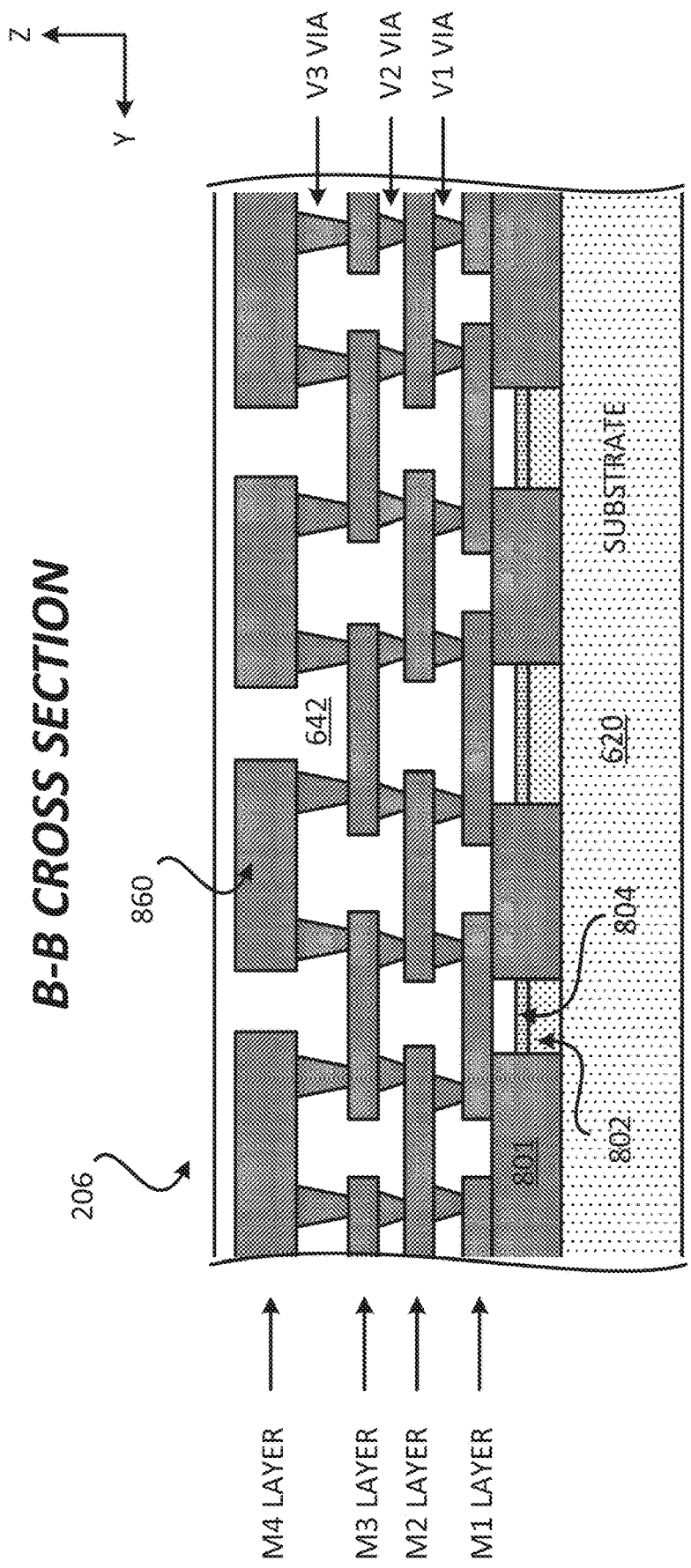
FIG. 8 illustrates a profile view of a periphery structure configured to operate as an electrical seal ring and a crack stop.

FIG. 8 illustrates a portion of a periphery structure that includes a plurality of protection interconnects. FIG. 8 may illustrate the periphery structure 206 along a cross section B-B of the integrated device 200. The periphery structure 206 includes a plurality of protection interconnects 860. The plurality of protection interconnects 860 may represent the first plurality of protection interconnects 260 and/or the second plurality of protection interconnects 262.

The periphery structure 206 is formed and located over the substrate 620. The periphery structure 206 may be part of an integrated device. The plurality of protection interconnects 860 includes interconnects located over the substrate 620. For example, the plurality of protection interconnects 860 includes the plurality of protection interconnects 801. The protection interconnects 801 includes substrate vias, interconnects on various metal layers (e.g., M1, M2, M3, M4) and interconnects (e.g., vias, V1 vias, V2 vias, V3 vias) located between metal layers of an integrated device 600. A buried oxide (BOX) layer 802 may located over and coupled to the substrate 620. A shallow trench isolation (STI) layer 804 may be located over and coupled to the BOX layer 802. The BOX layer 802 and the STI layer 804 may be located laterally of the plurality of protection interconnects 801. The plurality of protection interconnects 860 may be arranged in a row (and/or column) of protection interconnects. The plurality of protection interconnects 860 may be vertically staggered and/or offset. At least some of the protection interconnects 860 may be configured to be electrically coupled to one another. At least some of the protection interconnects 860 may be configured to be electrically coupled to ground. The various protection interconnects may each have similar or different lengths, widths and/or thicknesses. For example, protection interconnect on different metal layers may have different thicknesses. At least one dielectric layer 642 may be formed around the plurality of protection interconnects 860.

Figure 9:
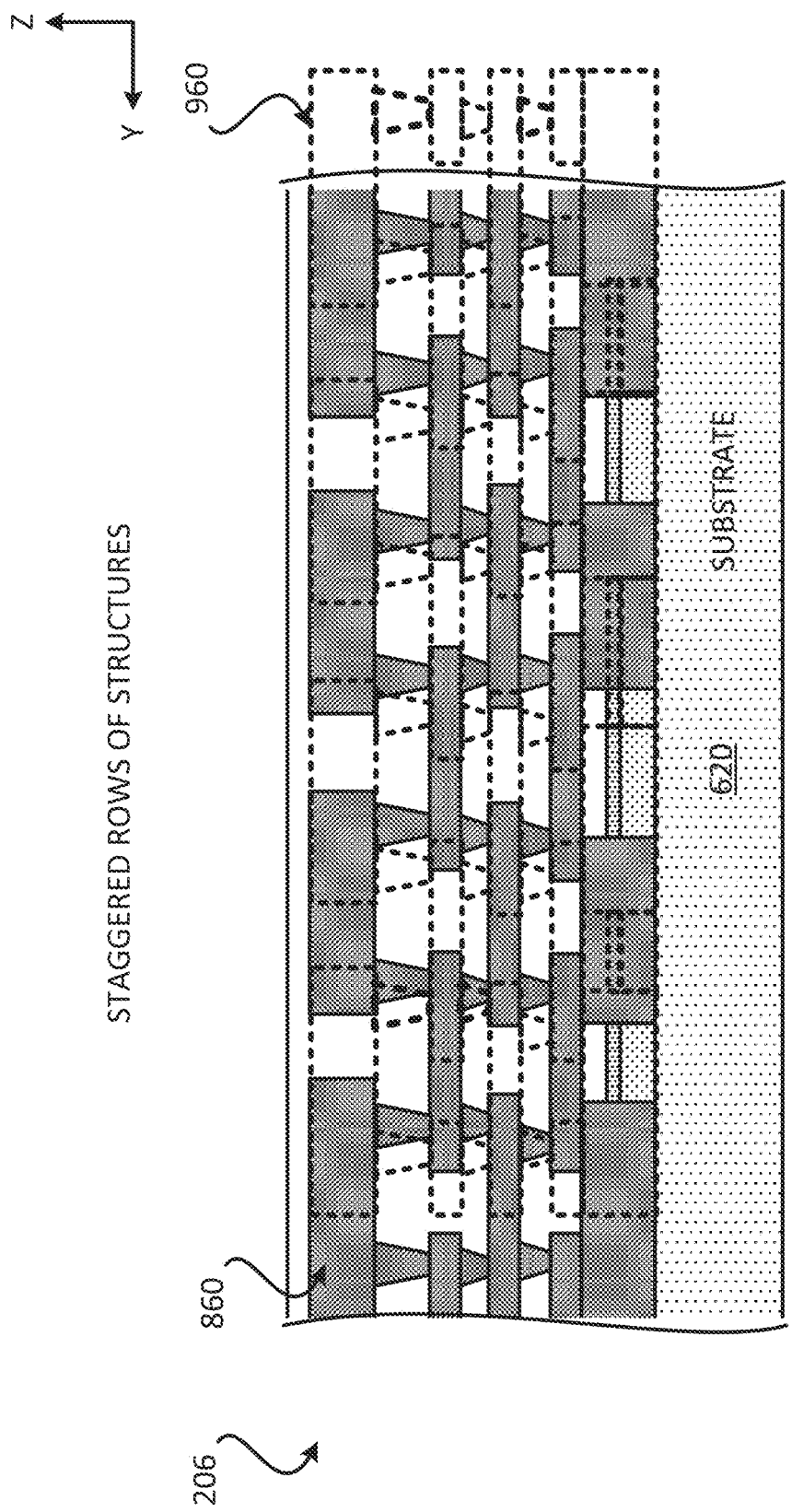
FIG. 9 illustrates a profile view of a periphery structure configured to operate as an electrical seal ring and a crack stop.

FIG. 9 illustrates a portion of a periphery structure that includes a plurality of protection interconnects. FIG. 9 may illustrate the periphery structure 206 along a cross section B-B of the integrated device 200. The periphery structure 206 includes a plurality of protection interconnects 860 and a plurality of protection interconnects 960. The plurality of protection interconnects 860 may represent the first plurality of protection interconnects 260 and the plurality of protection interconnects 960 may represent the second plurality of protection interconnects 262. The plurality of protection interconnects 960 may be similar to the plurality of protection interconnects 860. As shown in FIG. 9, the plurality of protection interconnects 960 is staggered or offset from the plurality of protection interconnects 860.

As mentioned above, some portions of a periphery structure may be configured (i) to be free of electrical coupling to other portions of the periphery structure and/or (ii) to be free of coupling to ground, when other portions of the periphery structure may be configured to be coupled to ground.

Figure 10:
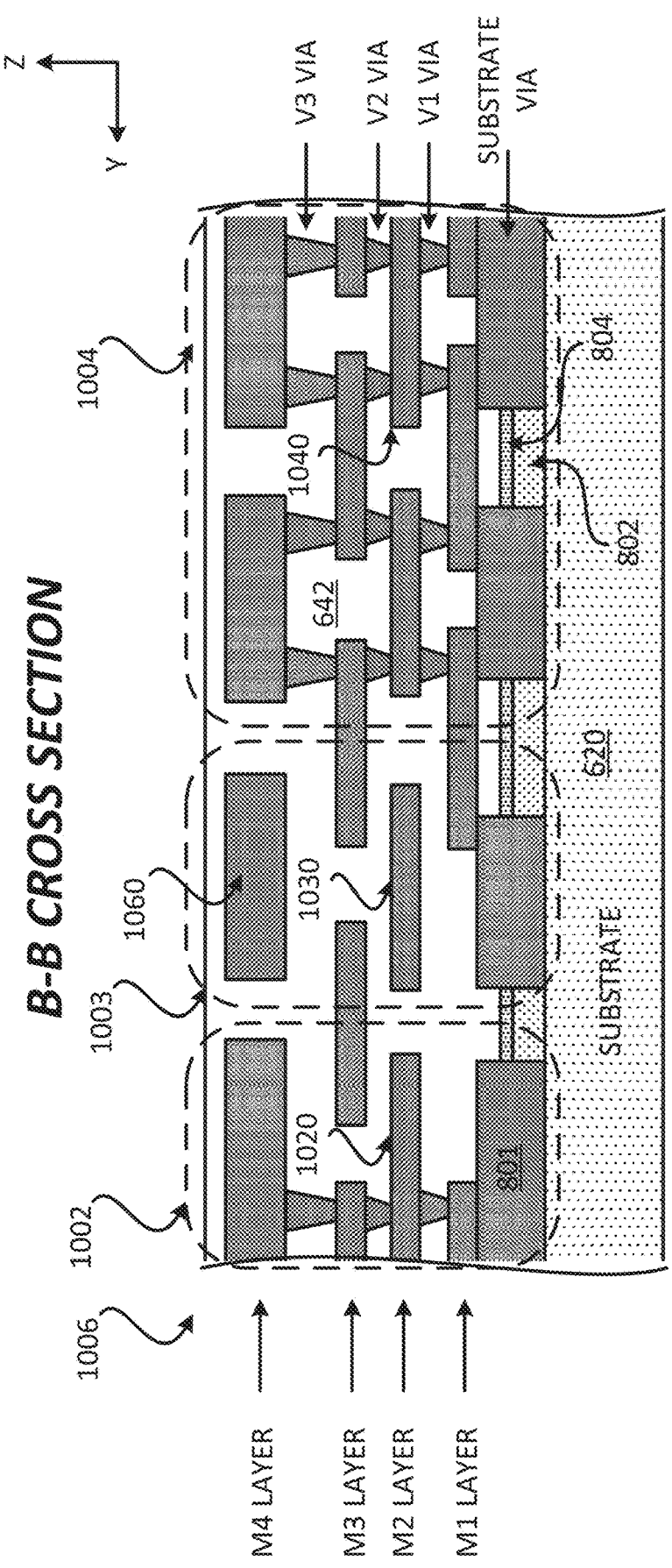
FIG. 10 illustrates a profile view of another periphery structure configured to operate as an electrical seal ring and a crack stop.

FIG. 10 illustrates a periphery structure 1006 that includes a first portion 1002, a second portion 1003 and a third portion 1004. The periphery structure 1006 may be located over the substrate 620. FIG. 10 may represent a profile view of the periphery structure 1006 along a B-B cross section of FIG. 2. The periphery structure 1006 may include a plurality of protection interconnects 1060. The first portion 1002 of the periphery structure 1006 may include a first plurality of protection interconnects 1020. The second portion 1003 of the periphery structure 1006 may include a second plurality of protection interconnects 1030. The third portion 1004 of the periphery structure 1006 may include a third plurality of protection interconnects 1040. The second portion 1003 is located between the first portion 1002 and the third portion 1004. The first plurality of protection interconnects 1020, the second plurality of protection interconnects 1030, and the third plurality of protection interconnects 1040 may be part of the plurality of protection interconnects 1060.

The first plurality of protection interconnects 1020 and the third plurality of protection interconnects 1040 may be configured to be electrically coupled to each other and/or ground. The second plurality of protection interconnects 1030 is located between the first plurality of protection interconnects 1020 and the third plurality of protection interconnects 1040. The second plurality of protection interconnects 1030 may be configured (i) to be free of electrical coupling with the first plurality of protection interconnects 1020 and the third plurality of protection interconnects 1040, and/or (ii) to be free of electrical coupling to ground. In some implementations, at least one signal may be able to travel through the second portion 1003 of the periphery structure 1006. The second portion 1003 may be an isolated portion of the periphery structure 1006, as described in FIG. 4. The second portion 1003 may be represent the isolated portion 404a or 404b.

Figure 11:
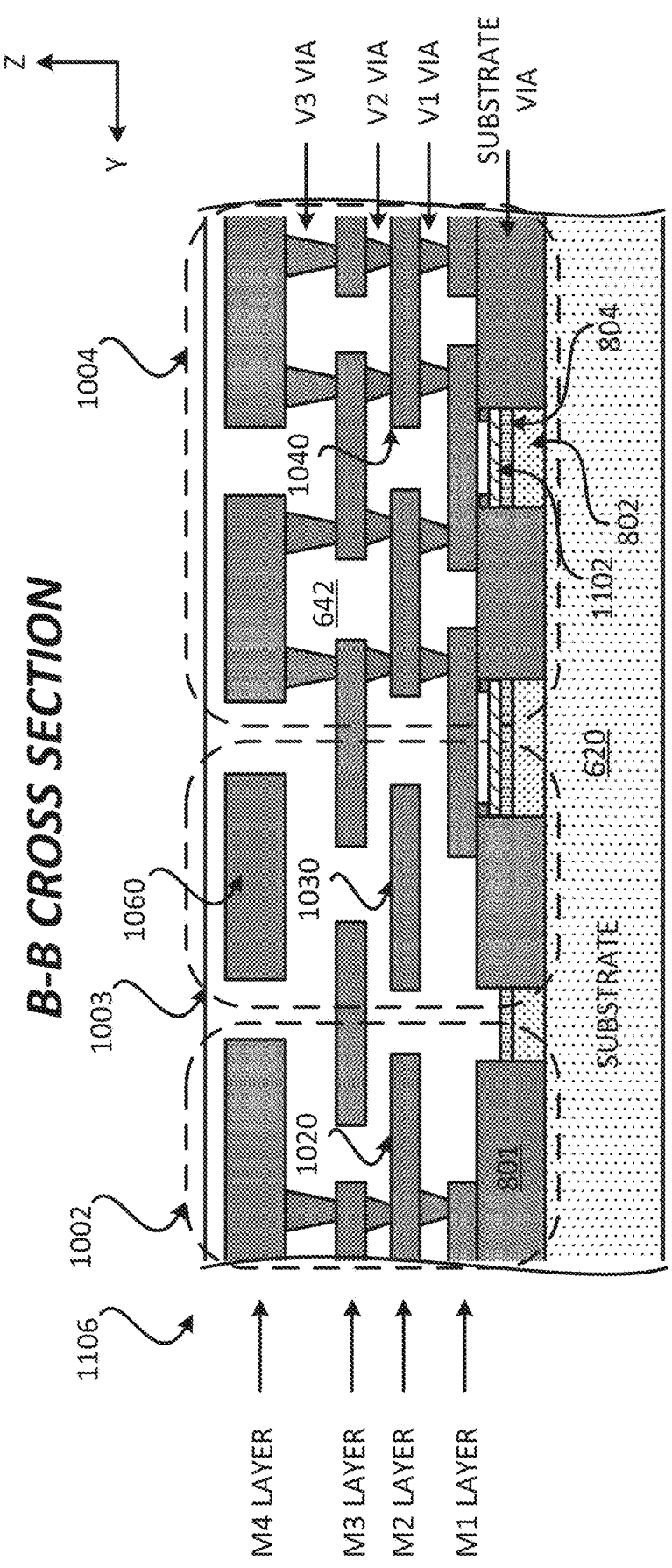
FIG. 11 illustrates a profile view of another periphery structure configured to operate as an electrical seal ring and a crack stop.

FIG. 11 illustrates a periphery structure 1106 that includes at least one resistor. The periphery structure 1106 is similar to the periphery structure 1006, and thus may include the same or similar components as the periphery structure 1006. FIG. 11 may represent a profile view of the periphery structure 1106 along a B-B cross section of FIG. 2. The periphery structure 1106 includes at least one poly-silicon layer 1102. The poly-silicon layer 1102 may be coupled to and located over the STI layer 804. The periphery structure 1106 may be tuned and/or modified by coupling or including at least one poly-silicon layer 1102 to the plurality of protection interconnects 1060. Adding more poly-silicon layers 1102 and/or coupling more poly-silicon layers 1102 to the plurality of protection interconnects 1060 may increase the effective resistance of the periphery structure 1006. The at least one poly-silicon layer 1102 may be used for providing poly resistors for changing the impedance of the electrical seal ring that may be needed for radio frequency (RF) circuits. In some implementations, the periphery structure 1106 may be configured to be electrically coupled to at least one resistive region of the substrate (e.g., region of the silicon) to provide resistors (e.g., silicon resistors) for the electrical seal ring. A resistive region may include components of a transistor. In some implementations, the periphery structure 1106 may be configured to be electrically coupled to at least one resistive region of the substrate and/or the poly-silicon layer 1102. The at least one poly-silicon layer 1102 and/or the silicon resistors may be used for providing resistors for changing the impedance of the electrical seal ring that may be needed for radio frequency (RF) circuits. In some implementations, increasing the resistivity of the periphery structure 1006 may help the periphery structure 1006 to be configured as a radio frequency (RF) decoupler. The poly-silicon layer 1102 may include a poly-silicon layer that includes a p dopant or a poly-silicon layer that includes a N dopant.

It is noted that the poly-silicon layer 1102 may be part or coupled to any of the periphery structures described in the disclosure. It is noted that FIGS. 8-11 may illustrate the periphery structure 206 and/or the periphery structure 306.

FIG. 12 illustrates a plan view of a periphery structure 1206 that includes three rows of a plurality of protection interconnects. As shown in FIG. 12, the periphery structure 1206 includes a first row of a first plurality of protection interconnects 1202, a second row of a second plurality of protection interconnects 1203, and a third row of a third plurality of protection interconnects 1204. The second row of a second plurality of protection interconnects 1203 may be laterally staggered to the first row of a first plurality of protection interconnects 1202. The third row of a third plurality of protection interconnects 1204 may be laterally staggered to the second row of a second plurality of protection interconnects 1203.

The first row of a first plurality of protection interconnects 1202 includes a plurality of protection interconnects 1220 (e.g., 1220a, 1220b, 1220c, 1220d), a plurality of protection interconnects 1222 (e.g., 1222a, 1222b, 1222c, 1222d) and a plurality of protection vias 1221. The second row of a second plurality of protection interconnects 1203 includes a plurality of protection interconnects 1230 (e.g., 1230a, 1230b, 1230c, 1230d), a plurality of protection interconnects 1232 (e.g., 1232a, 1232b, 1232c, 1232d) and a plurality of protection vias 1231. The third row of a third plurality of protection interconnects 1204 includes a plurality of protection interconnects 1240 (e.g., 1240a, 1240b, 1240c, 1240d), a plurality of protection interconnects 1242 (e.g., 1242a, 1242b, 1242c, 1242d) and a plurality of protection vias 1241.

FIG. 13 illustrates a side profile view of the first row of a first plurality of protection interconnects 1202. As shown in FIG. 13, the first row of a first plurality of protection interconnects 1202 includes protection interconnects that are vertically staggered. The first row of a first plurality of protection interconnects 1202 includes a plurality of protection interconnects 1220 (e.g., 1220a, 1220b, 1220c, 1220d), a plurality of protection interconnects 1222 (e.g., 1222a, 1222b, 1222c, 1222d), a plurality of protection interconnects 1224 (e.g., 1224a, 1224b, 1224c, 1224d), a plurality of protection vias 1221, a plurality of protection vias 1223 and a plurality of protection vias 1225.

The plurality of protection interconnects 1220, the plurality of protection interconnects 1222, the plurality of protection interconnects 1224, the plurality of protection vias 1221, the plurality of protection vias 1223 and the plurality of protection vias 1225 are coupled to each other. The plurality of protection interconnects 1220, the plurality of protection interconnects 1222 and the plurality of protection interconnects 1224 are vertically staggered. In some implementations, at least one of the vias from the plurality of protection vias 1221, the plurality of protection vias 1223 and/or the plurality of protection vias 1225 may be a via bar (e.g., protection via bar). FIG. 13 illustrates a via 1223a from the plurality of protection vias 1223 that is configured as via bar. A via bar may be coupled to two different interconnects on a same metal layer. In the example of FIG. 13, the via 1223a is coupled to the protection interconnect 1222b, the protection interconnect 1222c and the protection interconnect 1224b. The plurality of protection vias 1225 may be substrate vias (e.g., substrate protection vias).

The second row of the second plurality of protection interconnects 1203, and the third row of the third plurality of protection interconnects 1204 may be arranged in a similar manner as the first row of the first plurality of protection interconnects 1202.

Exemplary Sequence for Fabricating a Periphery Structure Over a Substrate

In some implementations, fabricating a periphery structure includes several processes. FIGS. 14A-14G illustrate an exemplary sequence for providing or fabricating a periphery structure over a substrate. In some implementations, the sequence of FIGS. 14A-14G may be used to provide or fabricate the periphery structure 1106 of FIG. 11. However, the process of FIGS. 14A-14G may be used to fabricate any of the periphery structures described in the disclosure. The process of FIGS. 14A-14G may be used to fabricated a periphery structure in an integrated device.

It should be noted that the sequence of FIGS. 14A-14G may combine one or more stages in order to simplify and/or clarify the sequence for providing or fabricating a periphery structure. In some implementations, the order of the processes may be changed or modified. In some implementations, one or more of processes may be replaced or substituted without departing from the spirit of the disclosure.

Figure 14A:
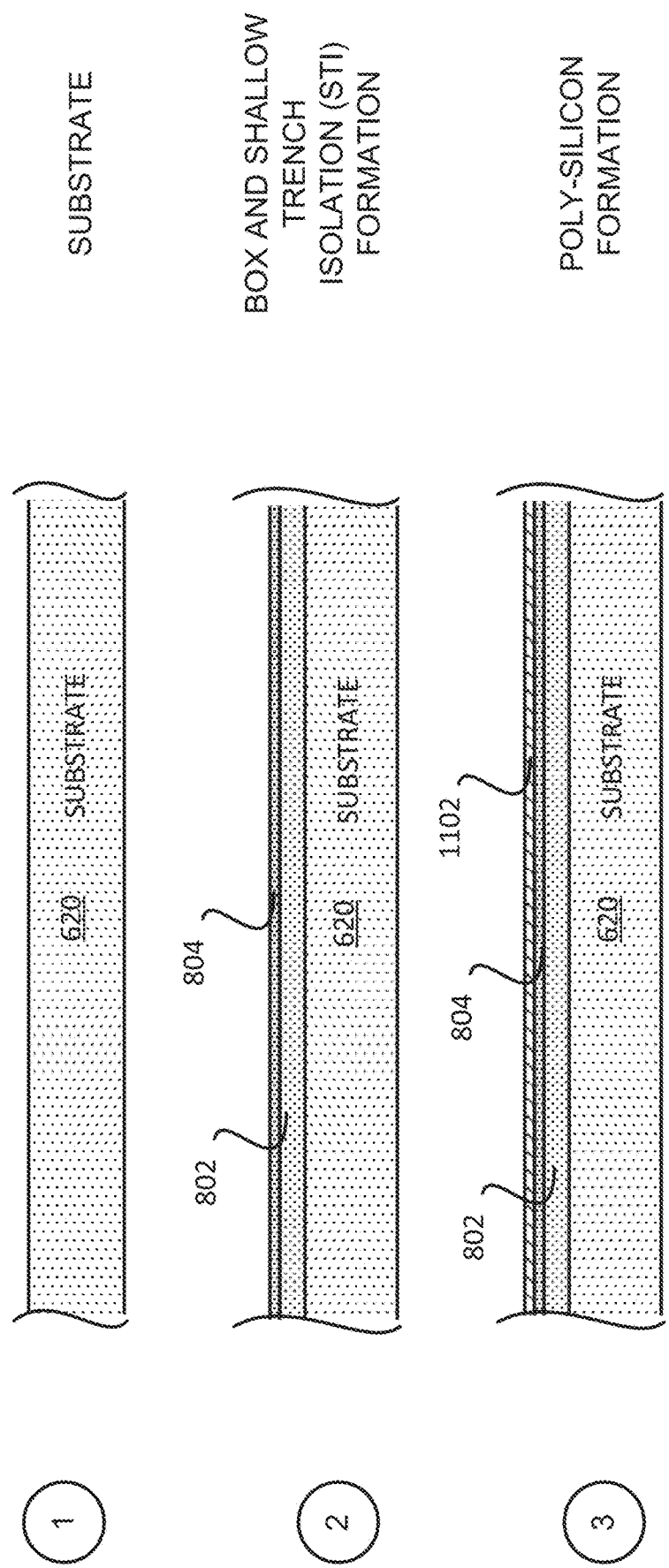

Stage 1, as shown in FIG. 14A, illustrates a state after a substrate 620 is provided. The substrate 620 may include silicon (Si).

Stage 2 illustrates a state after a BOX layer 802 and a shallow trench isolation (STI) layer 804 are formed over the substrate 620. The BOX layer 802 may include a buried oxide. The BOX layer 802 is formed over and coupled to the substrate 620. The STI layer 804 is formed over and coupled to the BOX layer 802. A deposition process may be used to form the BOX layer 802 and the STI layer 804.

Stage 3 illustrates a state after a poly-silicon layer 1102 is formed over and coupled to the STI layer 804. A deposition process may be used to form the poly-silicon layer 1102. The poly-silicon layer 1102 may be optional.

Figure 14B:
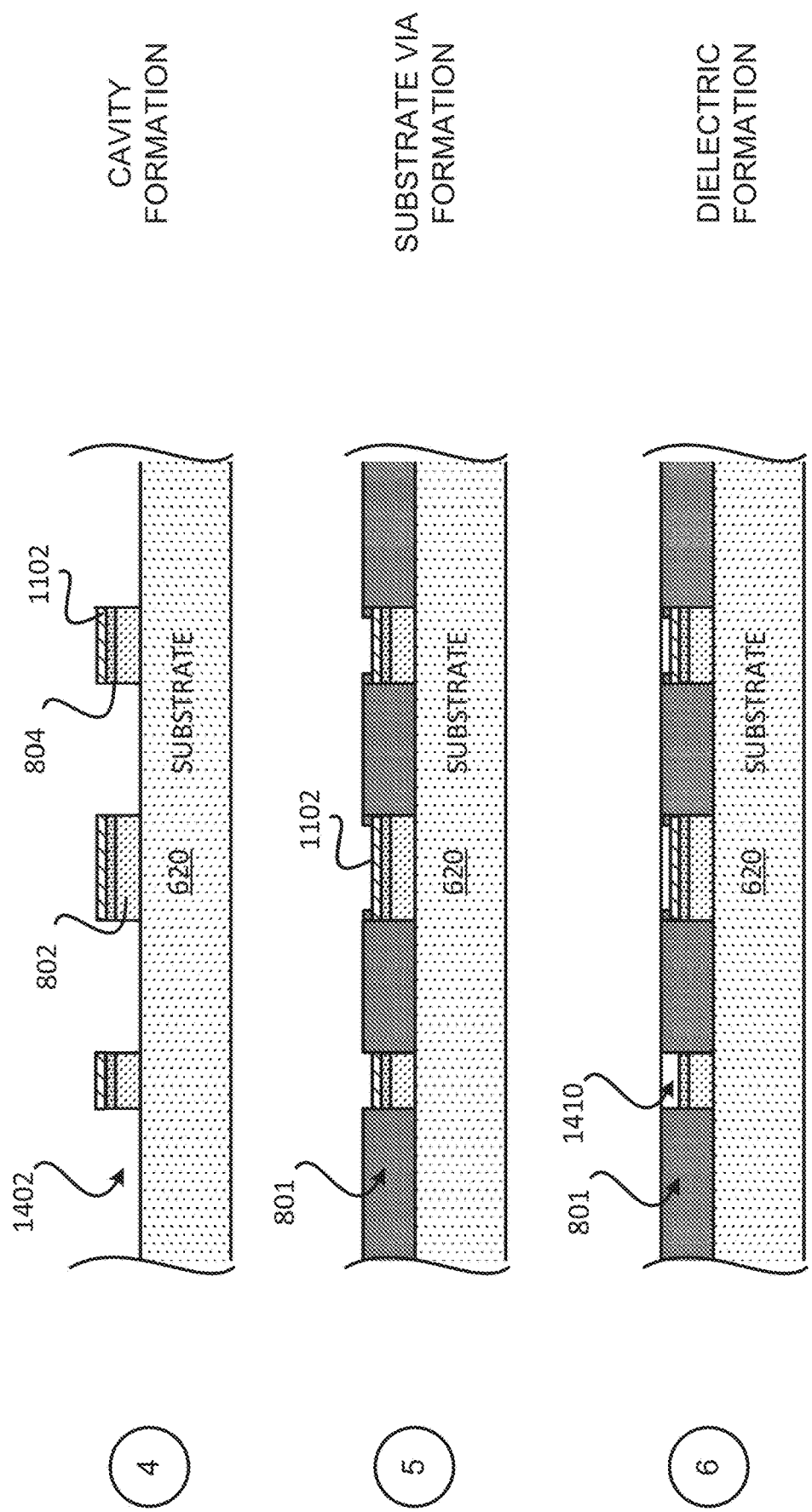

Stage 4, as shown in FIG. 14B, illustrates a state after cavities 1402 are formed in the BOX layer 802, the STI layer 804 and the poly-silicon layer 1102. A laser process or/and an etching process may be used to form the cavities 1402.

Stage 5 illustrates a state after a plurality of protection interconnects 801 is formed in the cavities 1402. A plating process may be used to form the plurality of protection interconnects 801. The plurality of protection interconnects 801 may include substrate vias (e.g., protection substrate vias). Part of the plurality of protection interconnects 801 may be formed over the poly-silicon layer 1102.

Stage 6 illustrates a state after a dielectric layer 1410 is formed over the poly-silicon layer 1102. If there is no poly-silicon layer 1102, the dielectric layer 1410 may be formed over the STI layer 804. Different implementations may use different materials for the dielectric layer. A deposition process or a coating process may be used to form the dielectric layer.

Stage 7, as shown in FIG. 14C, illustrates a state after a plurality of protection interconnects 1412 is formed over the plurality of protection interconnects 801 and the dielectric layer 1410. A plating process may be used to form the plurality of protection interconnects 1412. The plurality of protection interconnects 1412 may include traces and/or pads. The plurality of protection interconnects 1412 may be coupled to the plurality of protection interconnects 801. The plurality of protection interconnects 1412 may be coupled to the poly-silicon layer 1102. The plurality of protection interconnects 1412 may be configured to be electrically coupled to the poly-silicon layer 1102 (e.g., through the plurality of protection interconnects 801). The plurality of protection interconnects 1412 may include interconnects on a M1 layer.

Stage 8 illustrates a state after a dielectric layer 1420 is formed over the plurality of protection interconnects 1412 and the dielectric layer 1410. Different implementations may use different materials for the dielectric layer. A deposition process or a coating process may be used to form the dielectric layer.

Figure 14D:
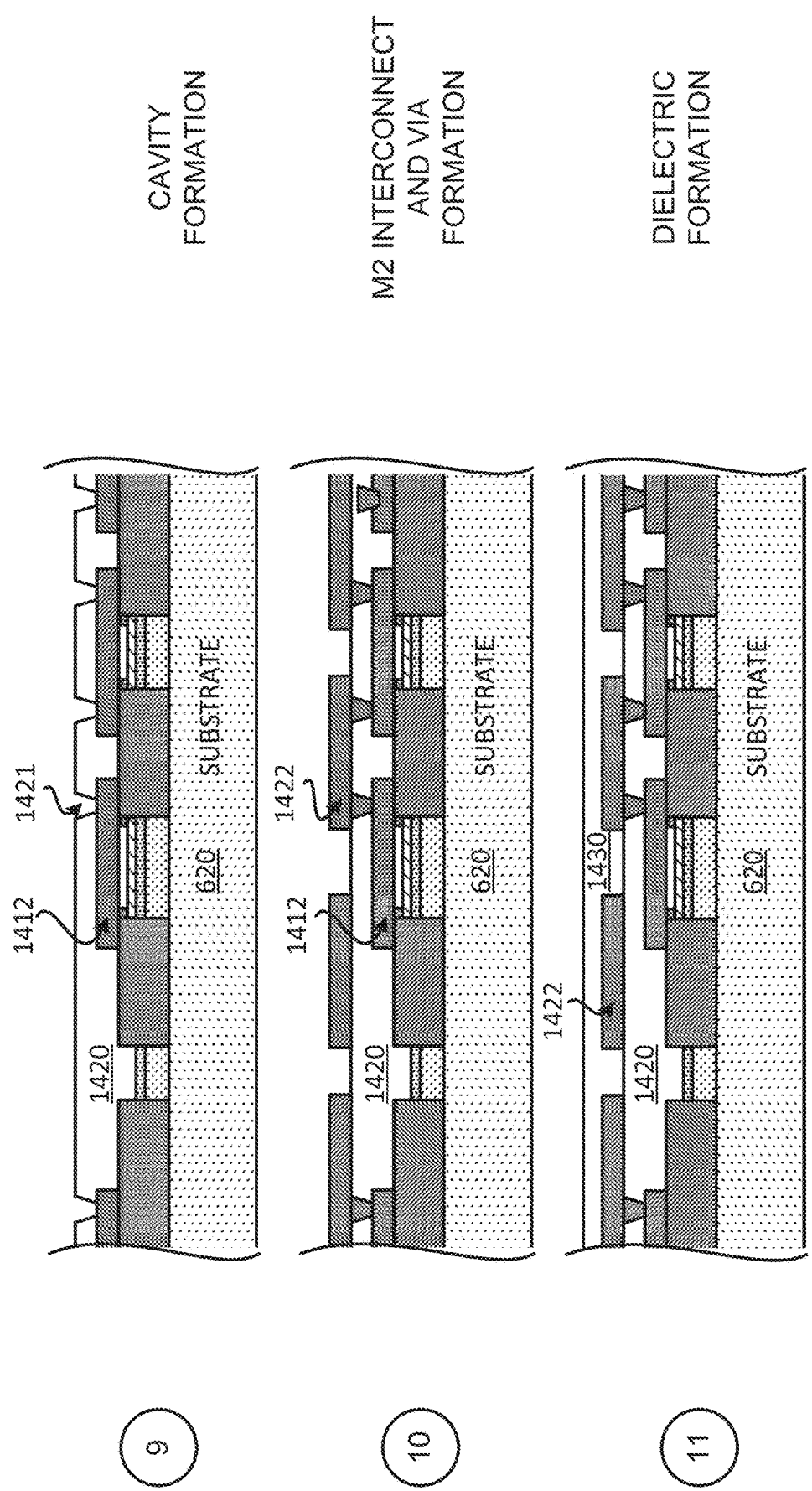

Stage 9, as shown in FIG. 14D, illustrates a state after a plurality of cavities 1421 is formed in the dielectric layer 1420. The plurality of cavities 1421 may be formed using an etching process (e.g., photo etching process) or laser process.

Stage 10 illustrates a state after a plurality of protection interconnects 1422 is formed over the cavities 1421 and the dielectric layer 1420. A plating process may be used to form the plurality of protection interconnects 1422. The plurality of protection interconnects 1422 may include traces, pads and/or vias. The plurality of protection interconnects 1422 may be coupled to the plurality of protection interconnects 1412. The plurality of protection interconnects 1422 may include interconnects on a M2 layer.

Stage 11 illustrates a state after a dielectric layer 1430 is formed over the plurality of protection interconnects 1422 and the dielectric layer 1420. Different implementations may use different materials for the dielectric layer. A deposition process or a coating process may be used to form the dielectric layer.

Stage 12, as shown in FIG. 14E, illustrates a state after a plurality of cavities 1431 is formed in the dielectric layer 1430. The plurality of cavities 1431 may be formed using an etching process (e.g., photo etching process) or laser process.

Stage 13 illustrates a state after a plurality of protection interconnects 1432 is formed over the cavities 1431 and the dielectric layer 1430. A plating process may be used to form the plurality of protection interconnects 1432. The plurality of protection interconnects 1432 may include traces, pads and/or vias. The plurality of protection interconnects 1432 may be coupled to the plurality of protection interconnects 1422. The plurality of protection interconnects 1432 may include interconnects on a M3 layer.

Figure 14F:
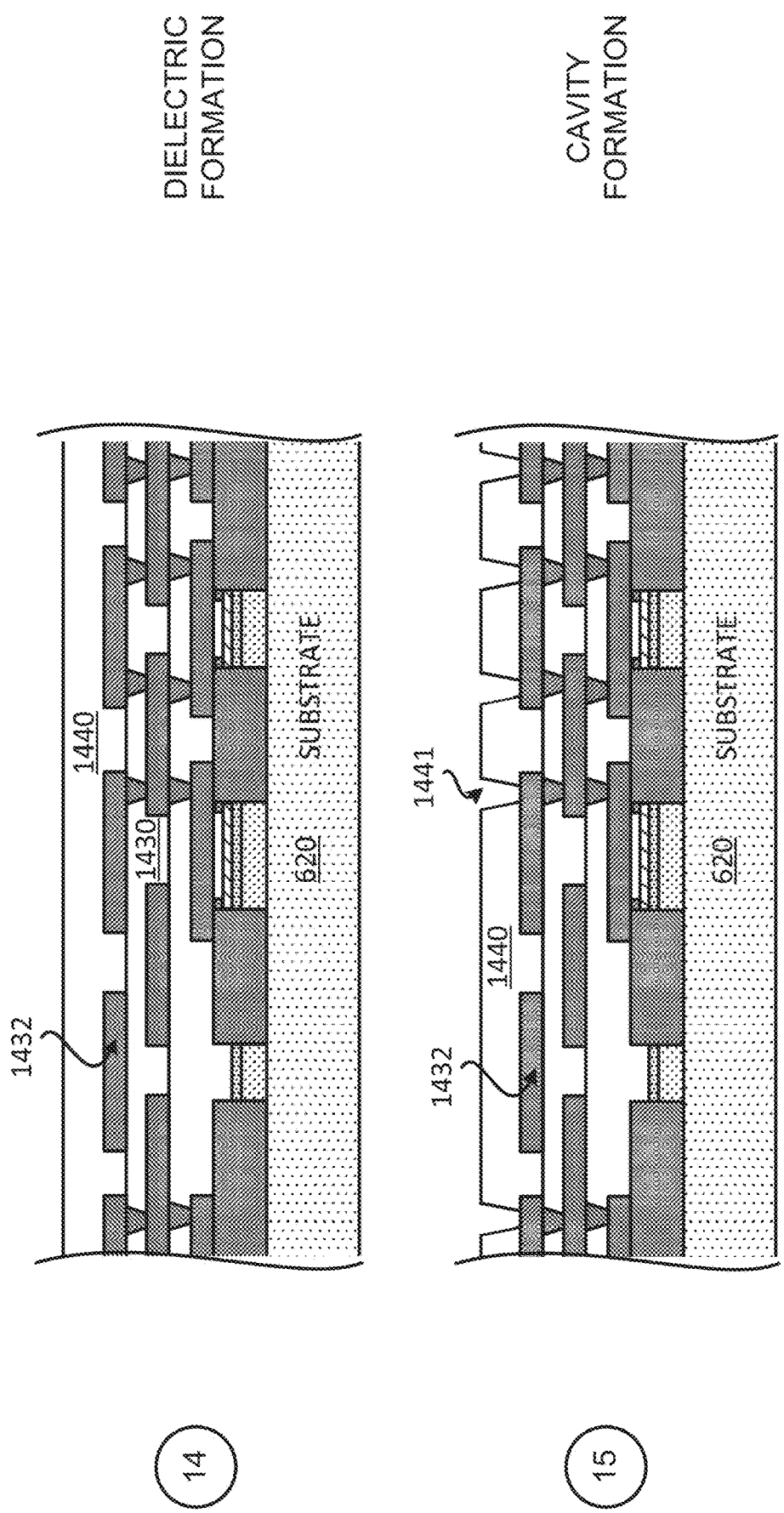

Stage 14, as shown in FIG. 14F, illustrates a state after a dielectric layer 1440 is formed over the plurality of protection interconnects 1432 and the dielectric layer 1430. Different implementations may use different materials for the dielectric layer. A deposition process or a coating process may be used to form the dielectric layer.

Stage 15 illustrates a state after a plurality of cavities 1441 is formed in the dielectric layer 1440. The plurality of cavities 1441 may be formed using an etching process (e.g., photo etching process) or laser process.

Figure 14G:
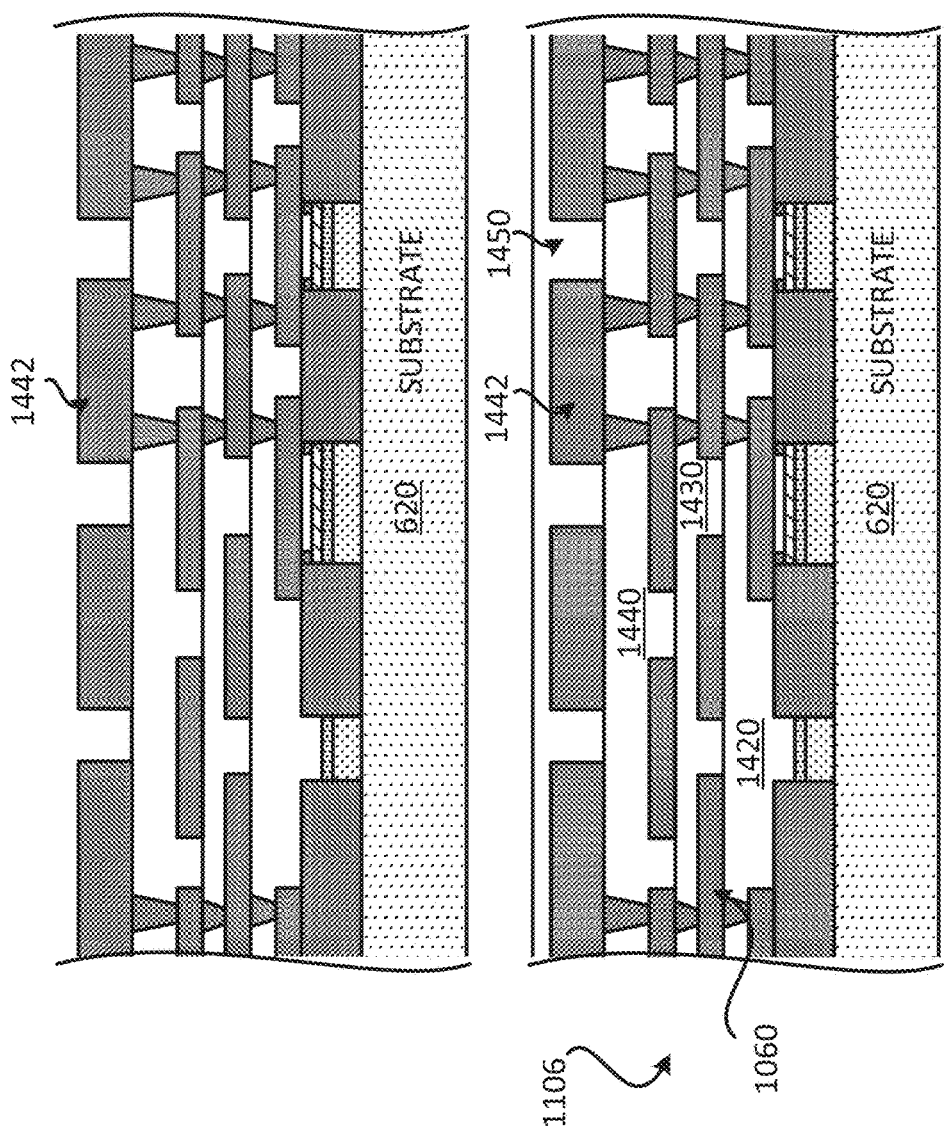

Stage 16, as shown in FIG. 14G, illustrates a state after a plurality of protection interconnects 1442 is formed over the cavities 1441 and the dielectric layer 1440. A plating process may be used to form the plurality of protection interconnects 1442. The plurality of protection interconnects 1442 may include traces, pads and/or vias. The plurality of protection interconnects 1442 may be coupled to the plurality of protection interconnects 1432. The plurality of protection interconnects 1442 may include interconnects on a M4 layer.

Stage 17 illustrates a state after a dielectric layer 1450 is formed over the plurality of protection interconnects 1442 and the dielectric layer 1440. Different implementations may use different materials for the dielectric layer. A deposition process or a coating process may be used to form the dielectric layer. The dielectric layers 1410, 1420, 1430, 1440 and/or 1450 may be represented by the dielectric layer 642.

Stage 17 may illustrate a periphery structure 1106 that includes the plurality of protection interconnects 1060 (e.g., 206). The plurality of protection interconnects 1060 may include the plurality of protection interconnects 801, 1412, 1422, 1432, and/or 1442.

It is noted that the process of FIGS. 14A-14G may be used to fabricated a periphery structure that includes various numbers of metal layers, include a periphery structure that has less than 4 metal layers or more than 4 metal layers.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 15:
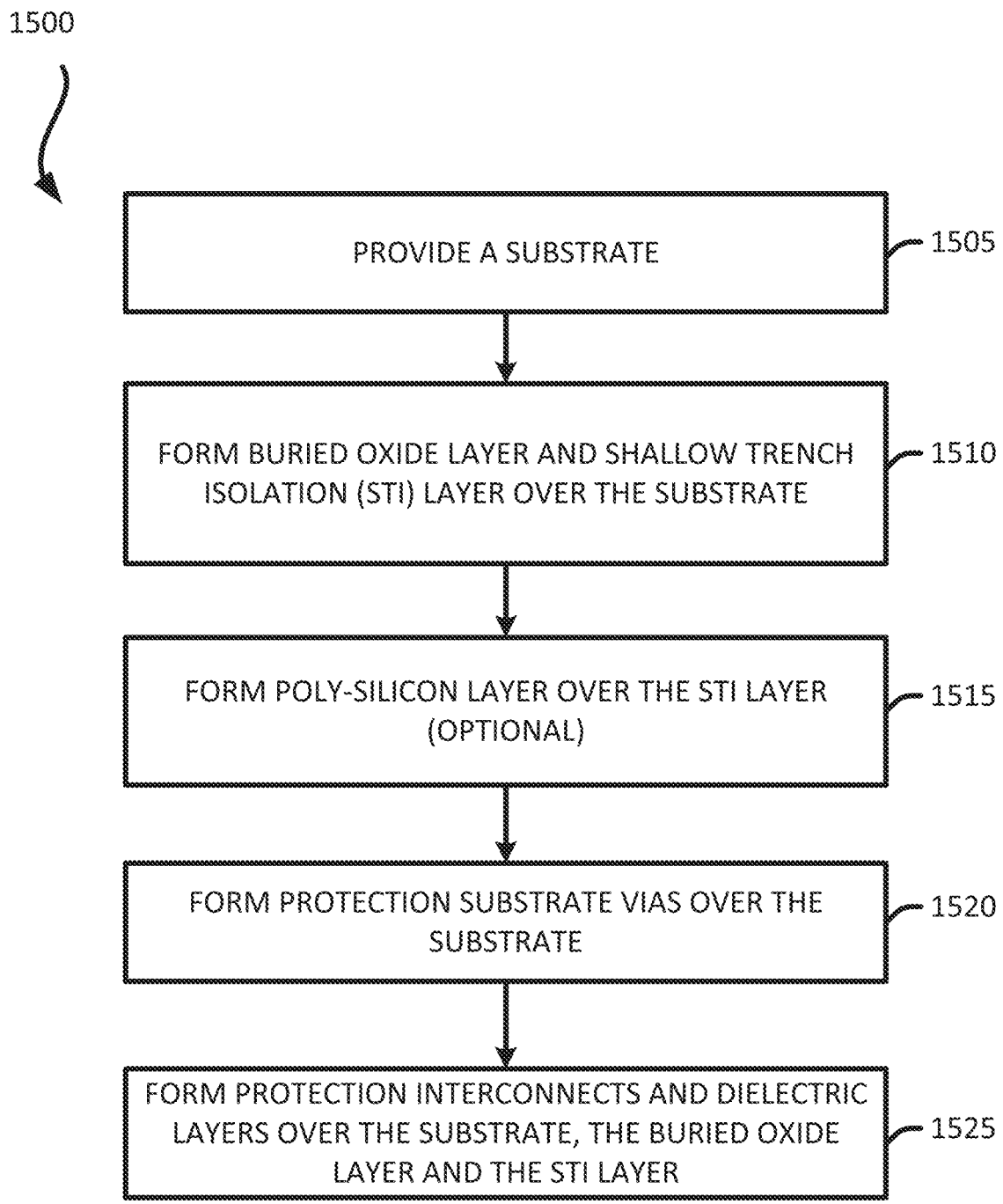
FIG. 15 illustrates an exemplary flow diagram of a method for fabricating a periphery structure configured to operate as an electrical seal ring and a mechanical crack stop

Exemplary Flow Diagram of a Method for Fabricating a Periphery Structure Over a Substrate In some implementations, fabricating a periphery structure includes several processes. FIG. 15 illustrates an exemplary flow diagram of a method 1500 for providing or fabricating a periphery structure configured to operate as electrical ring seal and a mechanical crack stop. In some implementations, the method 1500 of FIG. 15 may be used to provide or fabricate the periphery structure of FIG. 2. For example, the method of FIG. 15 may be used to fabricate the periphery structure 206. However, the method 1500 may be used to fabricated any of the periphery structures described in the disclosure and/or periphery structures with different numbers of metal layers.

It should be noted that the sequence of FIG. 15 may combine one or more processes in order to simplify and/or clarify the method for providing or fabricating a periphery structure. In some implementations, the order of the processes may be changed or modified.

The method provides (at 1505) a substrate 620. The substrate 620 may include silicon (Si). Stage 1 of FIG. 14A illustrates an example of a substrate that is provided.

The method forms (at 1510) forms a BOX layer 802 and a shallow trench isolation (STI) layer 804 over the substrate 620. The BOX layer 802 may include buried oxide. The BOX layer 802 is formed over the substrate 620. The STI layer 804 is formed over the BOX layer 802. A deposition process may be used to form the BOX layer 802 and the STI layer 804. Stage 2 of FIG. 14A illustrates an example of a BOX layer and a STI layer that is formed over a substrate.

The method optionally forms (at 1515) a poly-silicon layer 1102 over the STI layer 804. A deposition process may be used to form the poly-silicon layer 1102. Stage 3 of FIG. 14A illustrates an example of forming a poly-silicon layer over an STI layer.

The method forms (at 1520) a plurality of protection interconnects 801. The plurality of protection interconnects 801 may be protection substrate vias. The plurality of protection interconnects 801 may be formed in cavities of the BOX layer 802, the STI layer 804 and the poly-silicon layer 1102. 1402. A plating process may be used to form the plurality of protection interconnects 801. The plurality of protection interconnects 801 may be coupled to the poly-silicon layer 1102. Forming the plurality of protection interconnects 801 may include forming cavities in a BOX layer, a STI layer and a poly-silicon layer. Stages 4-5 of FIG. 14B illustrate examples of forming protection interconnects, such as protection substrate vias.

The method forms (at 1525) at least one protection interconnect (e.g., 1412) and at least one dielectric layer (e.g., 1410, 1420). A deposition process or a coating process may be used to form the dielectric layer. Forming the dielectric layer may also include forming a plurality of cavities (e.g., 1412) in the dielectric layer (e.g., 1410). The plurality of cavities may be formed using an etching process (e.g., photo etching) or laser process. A plating process may be used to form the protection interconnects (e.g., 1412, 1422). Forming protection interconnects may include providing a patterned metal layer over and/or in the dielectric layer. Forming the protection interconnects may include forming a plurality of protection vias. In some implementations, dielectric layers and protection interconnects may be alternatively formed. Stages 6-16 of FIGS. 14C-14G illustrate examples of forming at least one protection interconnect and at least one dielectric layer.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 16A:
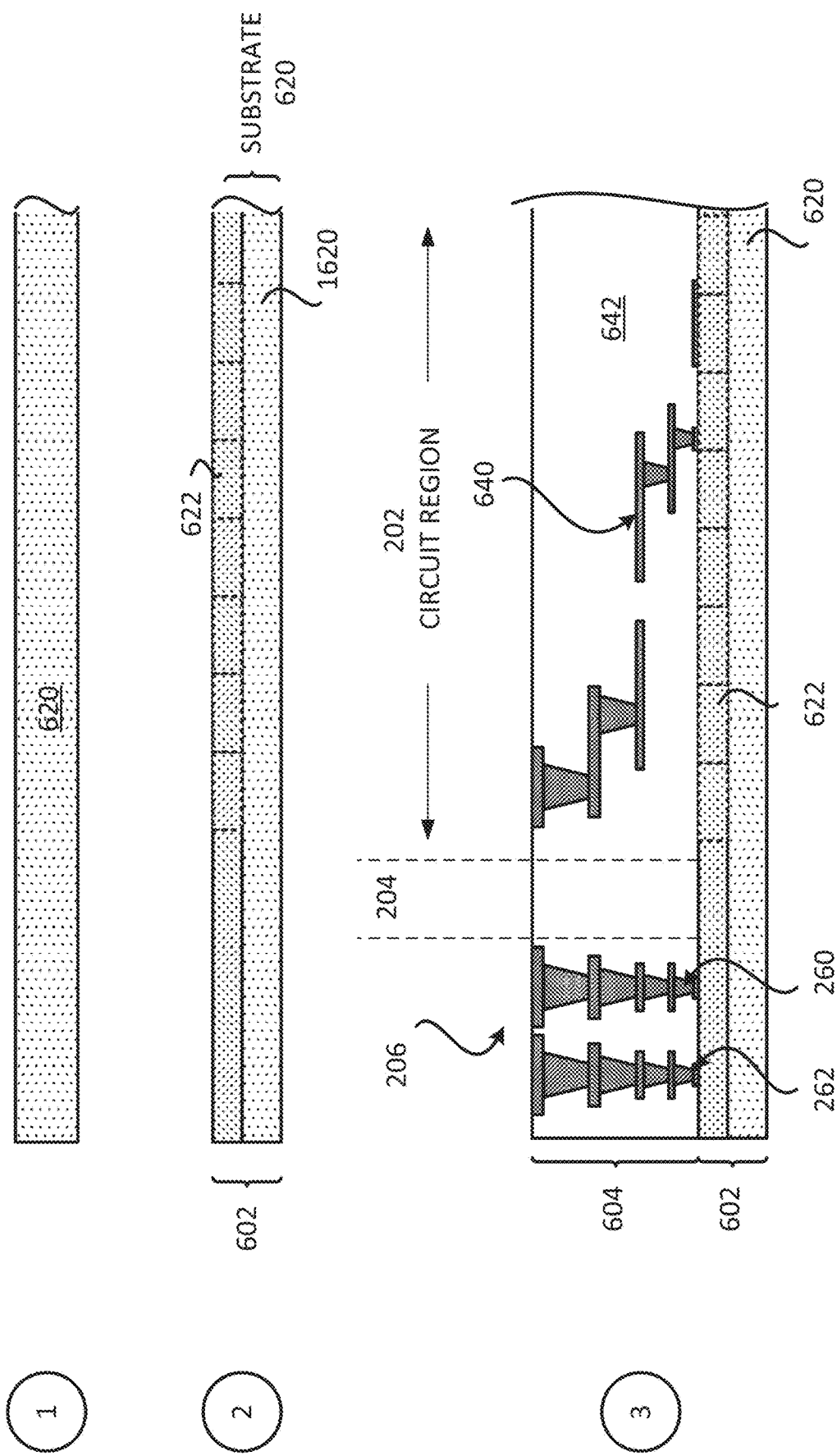
FIGS. 16A-16B illustrate an exemplary sequence for fabricating an integrated device that includes a periphery structure configured to operate as an electrical seal ring and a crack stop.
Figure 16B:
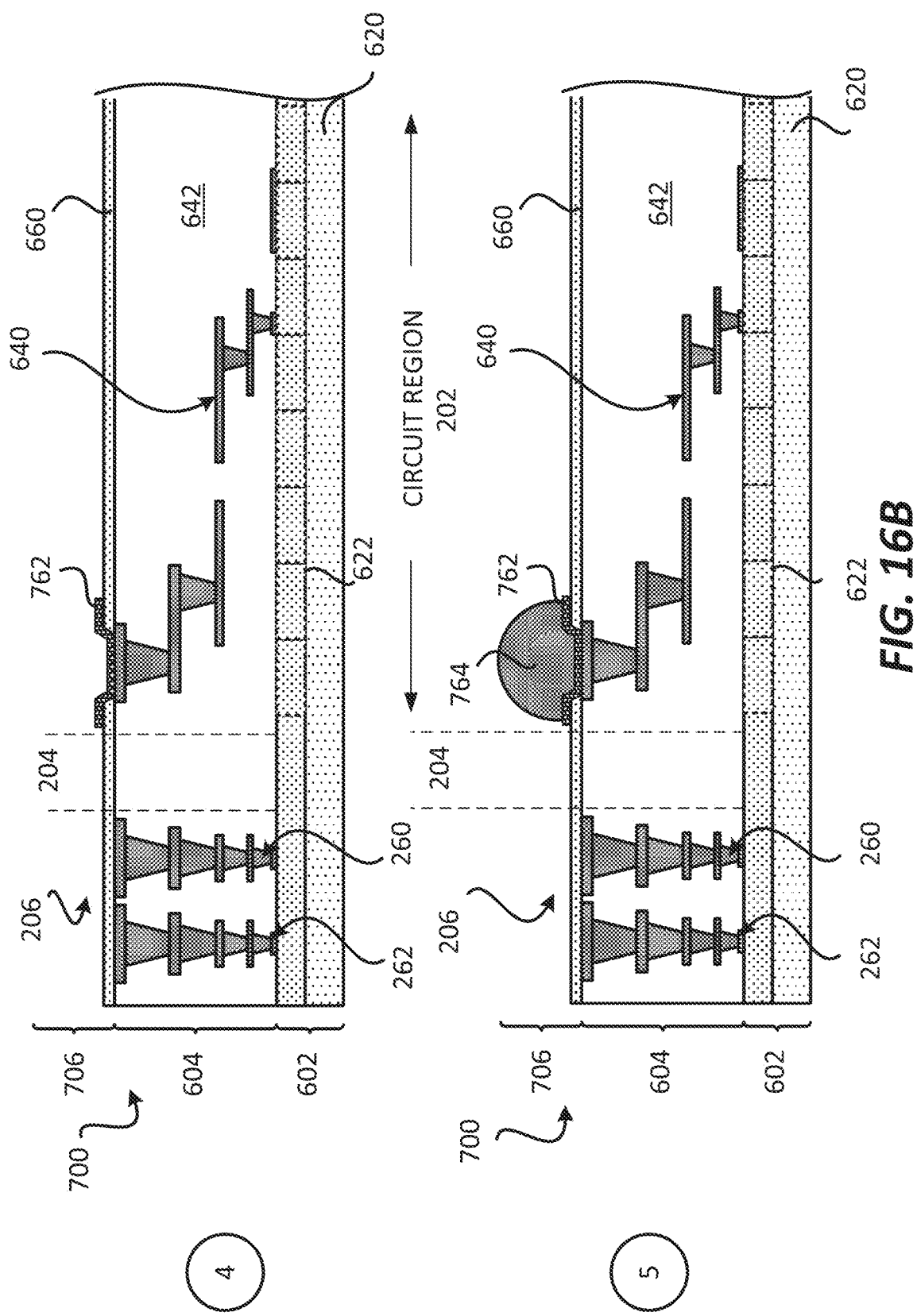

Exemplary Sequence for Fabricating an Integrated Device Comprising a Periphery Structure In some implementations, fabricating an integrated device that includes a periphery structure includes several processes. FIGS. 16A-16B illustrate an exemplary sequence for providing or fabricating an integrated device that includes a periphery structure configured to operate as electrical ring seal and a mechanical crack stop. In some implementations, the sequence of FIGS. 16A-16B may be used to provide or fabricate the integrated device of FIG. 7 and/or other integrated devices described in the present disclosure.

It should be noted that the sequence of FIGS. 16A-16B may combine one or more stages in order to simplify and/or clarify the sequence for providing or fabricating an integrated device that includes a periphery structure. In some implementations, the order of the processes may be changed or modified. In some implementations, one or more of processes may be replaced or substituted without departing from the spirit of the disclosure.

Stage 1, as shown in FIG. 16A, illustrates a state after a substrate 620 is provided. Different implementations may provide different materials for the substrate 620. In some implementations, the substrate 620 may include silicon (Si). The substrate 620 may be doped or undoped. The substrate 620 may be a semi-insulating substrate.

Stage 2 illustrates a state after a device level layer is formed over the substrate 1620. The device level layer includes the plurality of device level cells 622. Thus, Stage 2 illustrates a state after the plurality of device level cells 622 is formed over the substrate 620. In some implementations, a front end of line (FEOL) process may be used to fabricate the device level layer (e.g., plurality of device level cells 622). One or more of cells from the plurality of device level cells may include a transistor and/or a gate contact. In some implementations, interconnects may be formed over the gate, source and/or drain of one or more transistors. The plurality of device level cells 622 may be formed in the circuit region 202.

Stage 3 illustrates a state after the interconnect portion 604 is formed. The interconnect portion 604 may include plurality of interconnects 640 (located on different metal layers) and at least one dielectric layer 642. The plurality of interconnects 640 may be formed and located in the circuit region 202. In some implementations, a back end of line (BEOL) process may be used to fabricate the interconnect portion 604. The interconnect portion 604 may be configured to electrically couple one or more transistors. Forming the interconnect portion 604 may include forming a periphery structure (e.g., 206) that includes a plurality of protection interconnects 260 and a plurality of protection interconnects 262. Although not show at Stage 3, the interconnect portion 604 may include an interconnect 650 that is configured to be coupled to ground and to the periphery structure, as described in FIGS. 6 and 7.

Stage 4, as shown in FIG. 16B, illustrates a state after a passivation layer 660 and the under bump metallization (UBM) layer 762 are formed over the interconnect portion 604. A deposition process may be used to form the passivation layer 660. A plating process may be used to form the UBM layer 762.

Stage 5 illustrates a state after a solder interconnect 764 is coupled to the under bump metallization (UBM) layer 762. A reflow process may be used to couple the solder interconnect 764 to the UBM layer 762. Stage 5 may illustrate the integrated device 700 that includes the periphery structure 206 that is configured to operate as electrical seal ring and a crack stop for the integrated device.

Figure 17:
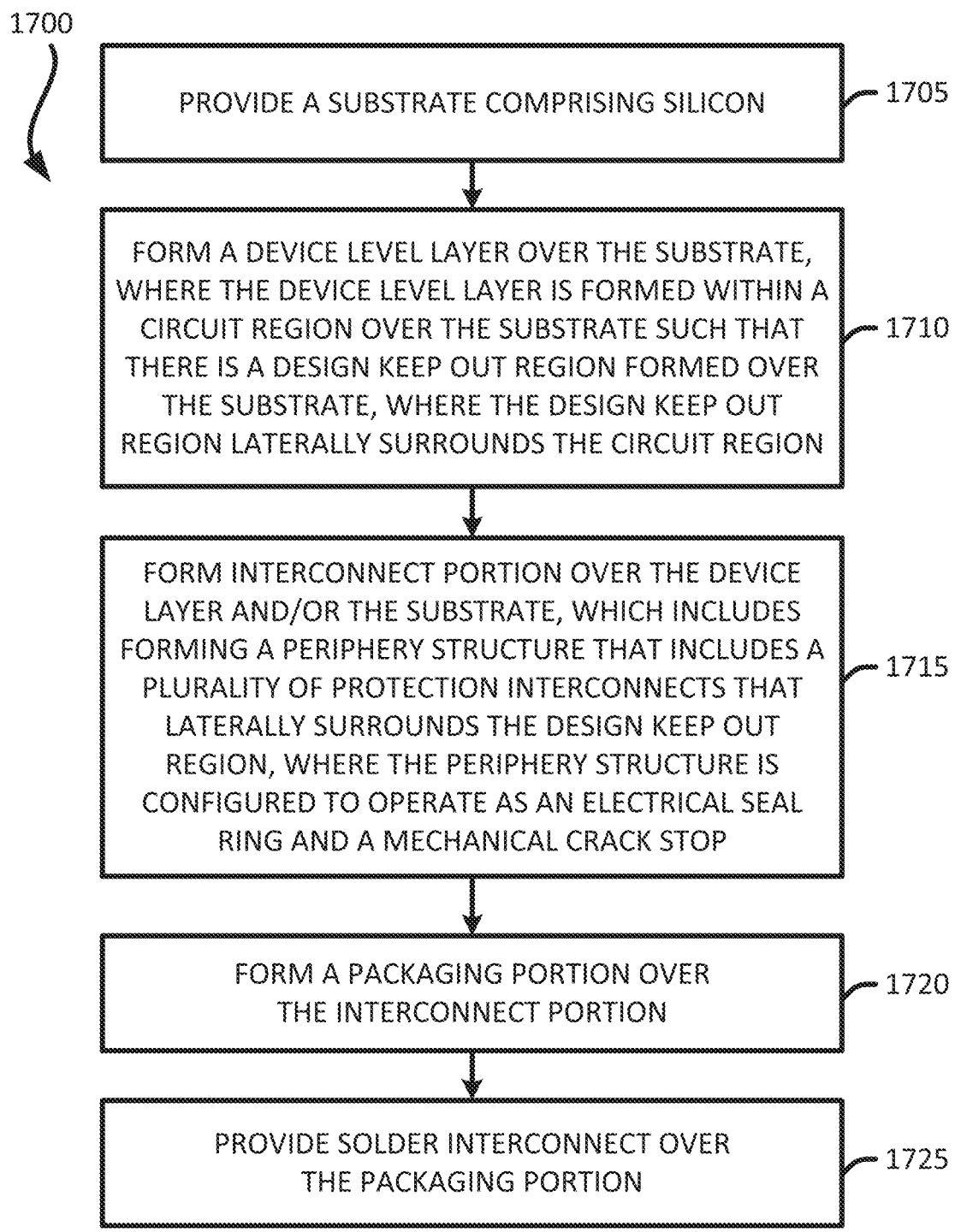
FIG. 17 illustrates an exemplary flow diagram of a method for fabricating an integrated device that includes a periphery structure configured to operate as an electrical seal ring and a crack stop.

Exemplary Flow Diagram of a Method for Fabricating an Integrated Device Comprising a Periphery Structure In some implementations, providing an integrated device that includes a periphery structure includes several processes. FIG. 17 illustrates an exemplary flow diagram of a method 1700 for providing or fabricating an integrated device that includes a periphery structure configured to operate as electrical seal ring and a mechanical crack stop. In some implementations, the method 1700 of FIG. 17 may be used to provide or fabricate the integrated device of FIG. 7 and/or other integrated devices described in the present disclosure.

It should be noted that the method of FIG. 17 may combine one or more processes in order to simplify and/or clarify the method for providing or fabricating an integrated device that includes periphery structure configured to operate as electrical seal ring and a crack stop. In some implementations, the order of the processes may be changed or modified.

The method provides (at 1705) a substrate (e.g., 620). Different implementations may provide different materials for the substrate. In some implementations, the substrate may include silicon (Si). The substrate may be doped with an N type dopant or a P type dopant. The substrate may be a semi-insulating substrate. Stage 1 of FIG. 16A illustrates an example of providing a substrate.

The method forms (at 1710) a device level layer (e.g., the plurality of device level cells 622) over the substrate. In some implementations, a front end of line (FEOL) process may be used to fabricate the device level layer (e.g., plurality of device level cells 622). The device level layer may include a plurality of device level cells. The device level cells may include one or more active devices. One or more device level cells may include a transistor. Forming the device level layer may include forming one or more transistors. In some implementations, forming a device level layer includes forming a transistor over the substrate. The device level layer may be formed within a circuit region over the substrate such that there is a design keep out region formed or defined over the substrate, where the design keep out region laterally surrounds the circuit region. Stage 2 of FIG. 16A illustrates an example of forming a device level layer.

The method forms (at 1715) an interconnect portion 604 over the device level layer (e.g., plurality of device level cells 622) and/or the substrate 620. The interconnect portion 604 may include a plurality of interconnect 1640 and at least one dielectric layer 642. In some implementations, a back end of line (BEOL) process may be used to form the interconnect portion 604. The interconnect portion 604 may include the M1 layer. The interconnect portion 604 may be configured to electrically couple one or more transistors. Forming the interconnect portion 604 may also include forming a periphery structure that includes a plurality of protection interconnects (e.g., first plurality of protection interconnects) that laterally surrounds the design keep out region, where the periphery structure is configured to operate as an electrical seal ring and a mechanical crack stop. Stage 3 of FIG. 16A illustrates an example of forming an interconnect portion 604 that includes a periphery structure comprising a plurality of protection interconnects.

The method forms (at 1720) a packaging portion 706 over the interconnect portion 604. The packaging portion 706 may include the passivation layer 660 and the under bump metallization (UBM) layer 762. The passivation layer 660 and the under bump metallization (UBM) layer 762 are formed over the interconnect portion 604. Stage 4 of FIG. 16B illustrates an example of forming a packaging portion.

The method provides (at 1725) a solder interconnect 764. In some implementations, the solder interconnect 764 is coupled to the under bump metallization (UBM) layer 762 through a reflow solder process. Stage 5 of FIG. 16B illustrates an example of coupling a solder interconnect to a packaging portion.

It is also noted that the method 1700 of FIG. 17 may be used to fabricate (e.g., concurrently fabricate) several integrated devices on a wafer. The wafer is then singulated (e.g., cut) into individual integrated devices. These singulated integrated devices may then be coupled to other integrated devices and/or printed circuit boards (PCBs).

Exemplary Electronic Devices

Figure 18:
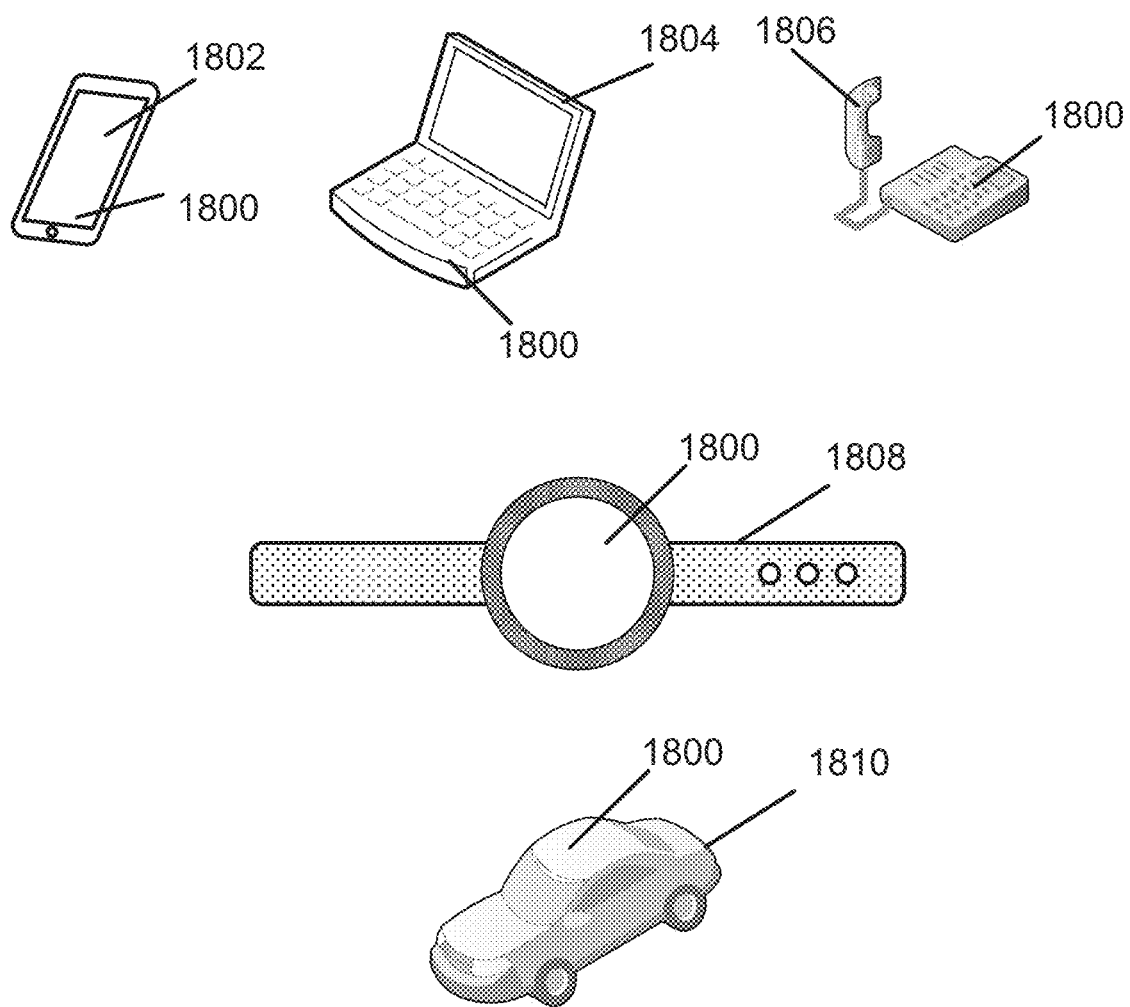
FIG. 18 illustrates various electronic devices that may integrate a die, an integrated device, an integrated passive device (IPD), a passive component, a package, and/or a device package described herein.

FIG. 18 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1802, a laptop computer device 1804, a fixed location terminal device 1806, a wearable device 1808, or automotive vehicle 1810 may include a device 1800 as described herein. The device 1800 may be, for example, any of the devices and/or integrated circuit (IC) packages described herein. The devices 1802, 1804, 1806 and 1808 and the vehicle 1810 illustrated in FIG. 18 are merely exemplary. Other electronic devices may also feature the device 1800 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-13, 14A-14G, 15, 16A-16B, and/or 17-18 may be rearranged and/or combined into a single component, process, feature or function or embodied in several components, processes, or functions. Additional elements, components, processes, and/or functions may also be added without departing from the disclosure. It should also be noted FIGS. 2-13, 14A-14G, 15, 16A-16B, and/or 17-18 and its corresponding description in the present disclosure is not limited to dies and/or ICs. In some implementations, FIGS. 2-13, 14A-14G, 15, 16A-16B, and/or 17-18 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. Electromagnetic coupling may mean that a signal from one circuit and/or component affects a signal of another circuit and/or component. Electromagnetic coupling may cause crosstalk. Electromagnetic coupling may be a form of signal coupling. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "top" and "bottom" are arbitrary. A component that is located on top may be located over a component that is located on a bottom. A top component may be considered a bottom component, and vice versa. The term "encapsulating" means that the object may partially encapsulate or completely encapsulate another object. The term "surrounding" means that an object may partially surround or completely surround another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect may include an electrically conductive material that may be configured to provide an electrical path for a signal (e.g., a data signal), ground and/or power. An interconnect may be part of a circuit. An interconnect may include more than one element or component. An interconnect may be defined by one or more interconnects. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An integrated device comprising:
a substrate;
a circuit region located over the substrate;
a design keep out region located over the substrate, the design keep out region laterally surrounding the circuit region; and
a periphery structure located over the substrate, the periphery structure comprising a first plurality of protection interconnects that laterally surrounds the design keep out region,
wherein the periphery structure is configured to operate as an electrical seal ring and a mechanical crack stop,
wherein the first plurality of protection interconnects comprises (i) a plurality of first protection interconnects located on a first metal layer, and (ii) a plurality of second protection interconnects located on a second metal layer,
wherein the second metal layer is located over the first metal layer,
wherein the plurality of first protection interconnects include a first protection interconnect,
wherein the plurality of second protection interconnects include a second protection interconnect and a third protection interconnect,
wherein the second protection interconnect on the second metal layer, vertically overlaps with the first protection interconnect on the first metal layer,
wherein the third protection interconnect on the second metal layer, vertically overlaps with the first protection interconnect on the first metal layer,
wherein the second protection interconnect is offset to the first protection interconnect, and
wherein the third protection interconnect is offset to the first protection interconnect.

2. The integrated device of claim 1, wherein the plurality of second protection interconnects on the second metal layer, are vertically staggered to the plurality of first protection interconnects on the first metal layer.

3. The integrated device of claim 1, wherein the periphery structure further comprises a second plurality of protection interconnects that laterally surrounds the first plurality of interconnects.

4. The integrated device of claim 3, wherein the second plurality of protection interconnects is laterally staggered to the first plurality of protection interconnects.

5. The integrated device of claim 1, wherein the first plurality of protection interconnects is configured to be coupled to ground.

6. The integrated device of claim 1,
wherein at least one protection interconnect from the first plurality of protection interconnects is configured to be coupled to ground, and
wherein at least one protection interconnect from the first plurality of protection interconnects is configured to be free of electrical coupling to ground.

7. The integrated device of claim 1,
wherein the integrated device includes at least one shallow trench isolation layer located in the substrate,
wherein the first plurality of protection interconnects includes substrate vias, and
wherein the substrate vias are located laterally to the at least one shallow trench isolation layer.

8. The integrated device of claim 1, wherein the first plurality of protection interconnects is coupled to a polysilicon layer.

9. The integrated device of claim 1,
wherein the circuit region includes a plurality of circuit components, and
wherein the design keep out region is free of an active component.

10. The integrated device of claim 1, wherein the integrated device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. The integrated device of claim 1,
wherein the first plurality of protection interconnects further comprises a plurality of third protection interconnects located on a third metal layer,
wherein the third metal layer is located over the second metal layer,
wherein the plurality of third protection interconnects include a fourth protection interconnect,
wherein the fourth protection interconnect on the third metal layer, vertically overlaps with the first protection interconnect on the first metal layer,
wherein the fourth protection interconnect on the third metal layer, vertically overlaps with (i) a part of the second protection interconnect on the second metal layer and (ii) a part of the third protection interconnect on the second metal layer,
wherein the fourth protection interconnect is offset to the second protection interconnect, and
wherein the fourth protection interconnect is offset to the third protection interconnect.

12. An apparatus comprising:
a substrate;
a circuit region located over the substrate;
a design keep out region located over the substrate, the design keep out region laterally surrounding the circuit region; and
means for periphery protection that laterally surrounds the design keep out region,
wherein the means for periphery protection is configured to operate as an electrical seal ring and a mechanical crack stop,
wherein the means for periphery protection comprises (i) a plurality of first protection interconnects located on a first metal layer, (ii) a plurality of second protection interconnects located on a second metal layer, and (iii) a plurality of vias coupled to the plurality of first protection interconnects and the plurality of second protection interconnects,
wherein the second metal layer is located over the first metal layer,
wherein the plurality of vias are located between the first metal layer and the second metal layer,
wherein the plurality of first protection interconnects include a first protection interconnect,
wherein the plurality of second protection interconnects include a second protection interconnect and a third protection interconnect,
wherein the plurality of vias includes a first via and a second via,
wherein the second protection interconnect on the second metal layer, vertically overlaps with the first protection interconnect on the first metal layer,
wherein the third protection interconnect on the second metal layer, vertically overlaps with the first protection interconnect on the first metal layer,
wherein the second protection interconnect is offset to the first protection interconnect along a length of the first protection interconnect,
wherein the third protection interconnect is offset to the first protection interconnect along the length of the first protection interconnect,
wherein the first via is coupled to the first protection interconnect and the second protection interconnect, and
wherein the second via is coupled to the first protection interconnect and the third protection interconnect.

13. The apparatus of claim 12, wherein the plurality of second protection interconnects on the second metal layer, are vertically staggered to the plurality of first protection interconnects on the first metal layer.

14. The apparatus of claim 13, wherein the first plurality of protection interconnects is configured to be coupled to ground.

15. The apparatus of claim 11, wherein the means for periphery protection further comprises a second plurality of protection interconnects that laterally surrounds the first plurality of protection interconnects.

16. The apparatus of claim 15, wherein the second plurality of protection interconnects is laterally staggered to the first plurality of protection interconnects.

17. The apparatus of claim 12,
wherein at least one protection interconnect from the first plurality of protection interconnects is configured to be coupled to ground, and
wherein at least one protection interconnect from the first plurality of protection interconnects is configured to be free of electrical coupling to ground.

18. The apparatus of claim 12,
wherein the substrate includes at least one shallow trench isolation layer,
wherein the means for periphery protection includes substrate vias, and
wherein the substrate vias are located laterally to the at least one shallow trench isolation layer.

19. The apparatus of claim 12, wherein the means for periphery protection is coupled to a poly-silicon layer.

20. The apparatus of claim 12,
wherein the circuit region includes a plurality of circuit components, and
wherein the design keep out region is free of an active component.

21. The apparatus of claim 12, wherein the apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

22. A method comprising:
providing a substrate;
forming a circuit region over the substrate such that there is a design keep out region located over the substrate, where the design keep out region laterally surrounds the circuit region; and
forming a periphery structure over the substrate, the periphery structure comprising a first plurality of protection interconnects that laterally surrounds the design keep out region,
wherein the periphery structure is configured to operate as an electrical seal ring and a mechanical crack stop,
wherein the first plurality of protection interconnects comprises (i) a plurality of first protection interconnects located on a first metal layer, and (ii) a plurality of second protection interconnects located on a second metal layer,
wherein the second metal layer is located over the first metal layer,
wherein the plurality of first protection interconnects include a first protection interconnect, wherein the plurality of second protection interconnects include a second protection interconnect and a third protection interconnect, wherein the second protection interconnect on the second metal layer, vertically overlaps with the first protection interconnect on the first metal layer, wherein the third protection interconnect on the second metal layer, vertically overlaps with the first protection interconnect on the first metal layer, wherein the second protection interconnect is offset to the first protection interconnect along a length of the first protection interconnect, and wherein the third protection interconnect is offset to the first protection interconnect along the length of the first protection interconnect.

23. The method of claim 22, wherein the plurality of second protection interconnects on the second metal layer, are vertically staggered to the plurality of first protection interconnects on the first metal layer.

24. The method of claim 22, wherein the periphery structure is coupled to a poly-silicon layer.

\* \* \* \* \*